US010873347B2

(12) United States Patent
Liao et al.

(10) Patent No.: US 10,873,347 B2
(45) Date of Patent: Dec. 22, 2020

(54) CHANNEL BIT INTERLEAVER DESIGN FOR POLAR CODING CHAIN

(71) Applicant: Mediatek Inc., Hsin-Chu (TW)

(72) Inventors: Yiju Liao, Hsinchu (TW); Wei-De Wu, Hsinchu (TW); Chia-Wei Tai, Hsinchu (TW)

(73) Assignee: MEDIATEK INC., Hsin-Chu (TW)

(*) Notice: Subject to any disclaimer, the term of this patent is extended or adjusted under 35 U.S.C. 154(b) by 193 days.

(21) Appl. No.: 16/055,480

(22) Filed: Aug. 6, 2018

(65) Prior Publication Data

US 2019/0044544 A1 Feb. 7, 2019

Related U.S. Application Data

(60) Provisional application No. 62/558,894, filed on Sep. 15, 2017, provisional application No. 62/556,557, (Continued)

(51) Int. Cl.
*H03M 13/13* (2006.01)
*H04L 1/00* (2006.01)
(Continued)

(52) U.S. Cl.
CPC ....... *H03M 13/2778* (2013.01); *H03M 13/13* (2013.01); *H03M 13/2707* (2013.01);
(Continued)

(58) Field of Classification Search
CPC ......... H03M 13/2778; H03M 13/2707; H03M 13/13; H03M 13/251; H04L 1/0041; H04L 1/0086; H04L 1/0057; H04L 1/0067; H04L 1/0071; H04L 1/1812; H04L 1/1835; H04L 5/0053; H04L 5/0048; H04L 27/34
See application file for complete search history.

(56) References Cited

U.S. PATENT DOCUMENTS 10,171,204 B2 * 1/2019 Wu ................. H04L 1/0068
10,432,234 B2 * 10/2019 Wu ................. H03M 13/155
(Continued)

FOREIGN PATENT DOCUMENTS

TW 200913557 A 3/2009
TW 200913559 A 3/2009

OTHER PUBLICATIONS

Taiwan Patent Office, "Office Action", dated Oct. 17, 2019, Taiwan.

*Primary Examiner* — Cynthia Britt
(74) *Attorney, Agent, or Firm* — Locke Lord LLP; Tim Tingkang Xia, Esq.

(57) ABSTRACT

In an aspect of the disclosure, a method, a computer-readable medium, and wireless equipment are provided. The wireless equipment interleaves a first sequence of encoded bits output from an encoder and then manipulating the interleaved first sequence of encoded bits to generate a second sequence of encoded bits. The wireless equipment places the second sequence of encoded bits in a buffer. The wireless equipment selects, from the buffer, a first section of the second sequence of encoded bits for transmission. The wireless equipment interleaves the first section of encoded bits. The wireless equipment transmits the interleaved first section of encoded bits via one or more symbols.

22 Claims, 14 Drawing Sheets

Related U.S. Application Data filed on Sep. 11, 2017, provisional application No. 62/546,039, filed on Aug. 16, 2017, provisional application No. 62/541,825, filed on Aug. 7, 2017.

(51) Int. Cl.

| | | |
|---|---|---|
| *H03M 13/27* | (2006.01) | |
| *H04L 1/18* | (2006.01) | |
| *H04L 5/00* | (2006.01) | |
| *H04L 27/34* | (2006.01) | |
| *H03M 13/25* | (2006.01) | |

(52) U.S. Cl.
CPC .......... *H04L 1/0041* (2013.01); *H04L 1/0057* (2013.01); *H04L 1/0067* (2013.01); *H04L 1/0071* (2013.01); *H04L 1/0086* (2013.01); *H04L 1/1812* (2013.01); *H04L 1/1835* (2013.01); *H04L 5/0053* (2013.01); *H03M 13/251* (2013.01); *H04L 5/0048* (2013.01); *H04L 27/34* (2013.01)

(56) References Cited

U.S. PATENT DOCUMENTS

| | | | |
|---|---|---|---|
| 2010/0002792 A1* | 1/2010 | Seyedi-Esfahani | ......................... H04L 1/0071 375/260 |
| 2015/0143207 A1 | 5/2015 | Cheng | |
| 2015/0236884 A1* | 8/2015 | Suh | ........ H04H 20/33 375/295 |
| 2018/0007683 A1* | 1/2018 | You | ................... H04W 72/0413 |
| 2020/0028622 A1* | 1/2020 | Beale | ................. H04L 27/2621 |
| 2020/0052809 A1* | 2/2020 | Hong | ....................... H04L 1/00 |
| 2020/0099471 A1* | 3/2020 | Ye | ..................... H03M 13/6362 |

* cited by examiner

CHANNEL BIT INTERLEAVER DESIGN FOR POLAR CODING CHAIN

CROSS-REFERENCE TO RELATED APPLICATION(S)

This application claims the benefit of U.S. Provisional Application Ser. No. 62/541,825, entitled "CHANNEL BIT INTERLEAVING DESIGN FOR POLAR CODING CHAIN" and filed on Aug. 7, 2017, U.S. Provisional Application Ser. No. 62/546,039, entitled "CHANNEL BIT INTERLEAVING DESIGN FOR POLAR CODING CHAIN" and filed on Aug. 16, 2017, U.S. Provisional Application Ser. No. 62/556,557, entitled "CHANNEL BIT INTERLEAVER DESIGN FOR POLAR CODING CHAIN" and filed on Sep. 11, 2017, and U.S. Provisional Application Ser. No. 62/558,894, entitled "CHANNEL BIT INTERLEAVER DESIGN FOR POLAR CODING CHAIN" and filed on Sep. 15, 2017, which are expressly incorporated by reference herein in their entirety.

BACKGROUND

Field

The present disclosure relates generally to communication systems, and more particularly, to techniques of channel bit interleaving of polar coded bits.

Background

The statements in this section merely provide background information related to the present disclosure and may not constitute prior art.

Wireless communication systems are widely deployed to provide various telecommunication services such as telephony, video, data, messaging, and broadcasts. Typical wireless communication systems may employ multiple-access technologies capable of supporting communication with multiple users by sharing available system resources. Examples of such multiple-access technologies include code division multiple access (CDMA) systems, time division multiple access (TDMA) systems, frequency division multiple access (FDMA) systems, orthogonal frequency division multiple access (OFDMA) systems, single-carrier frequency division multiple access (SC-FDMA) systems, and time division synchronous code division multiple access (TD-SCDMA) systems.

These multiple access technologies have been adopted in various telecommunication standards to provide a common protocol that enables different wireless devices to communicate on a municipal, national, regional, and even global level. An example telecommunication standard is 5G New Radio (NR). 5G NR is part of a continuous mobile broadband evolution promulgated by Third Generation Partnership Project (3GPP) to meet new requirements associated with latency, reliability, security, scalability (e.g., with Internet of Things (IoT)), and other requirements. Some aspects of 5G NR may be based on the 4G Long Term Evolution (LTE) standard. There exists a need for further improvements in 5G NR technology. These improvements may also be applicable to other multi-access technologies and the telecommunication standards that employ these technologies.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

In an aspect of the disclosure, a method, a computer-readable medium, and wireless equipment are provided. The wireless equipment interleaves a first sequence of encoded bits output from an encoder and then manipulating the interleaved first sequence of encoded bits to generate a second sequence of encoded bits. The wireless equipment places the second sequence of encoded bits in a buffer. The wireless equipment selects, from the buffer, a first section of the second sequence of encoded bits for transmission. The wireless equipment interleaves the first section of encoded bits. The wireless equipment transmits the interleaved first section of encoded bits via one or more symbols.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

DETAILED DESCRIPTION

Figure 1:
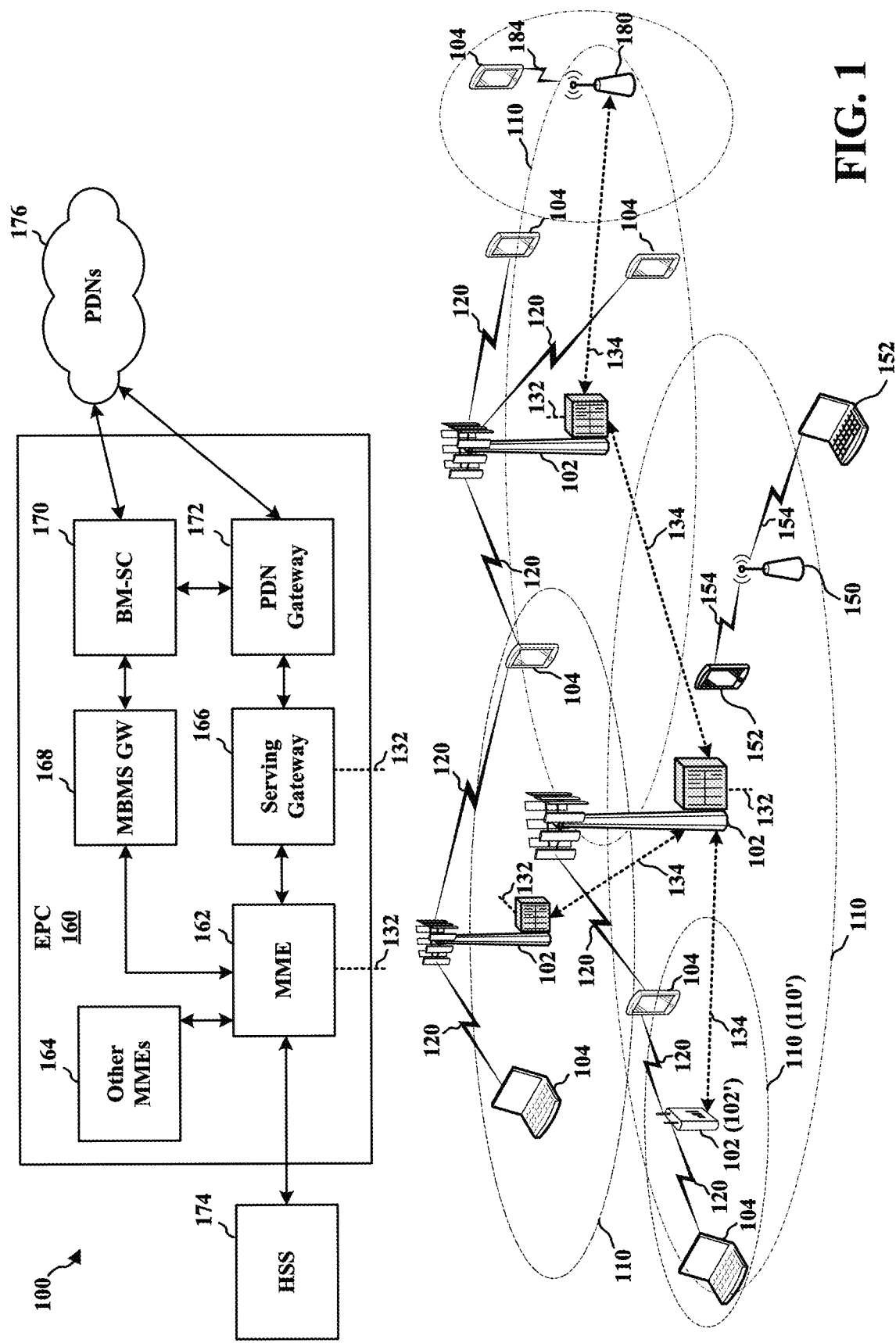
FIG. 1 is a diagram illustrating an example of a wireless communications system and an access network.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Several aspects of telecommunication systems will now be presented with reference to various apparatus and methods. These apparatus and methods will be described in the following detailed description and illustrated in the accompanying drawings by various blocks, components, circuits, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

By way of example, an element, or any portion of an element, or any combination of elements may be implemented as a "processing system" that includes one or more processors. Examples of processors include microprocessors, microcontrollers, graphics processing units (GPUs), central processing units (CPUs), application processors, digital signal processors (DSPs), reduced instruction set computing (RISC) processors, systems on a chip (SoC), baseband processors, field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software components, applications, software applications, software packages, routines, subroutines, objects, executables, threads of execution, procedures, functions, etc., whether referred to as software, firmware, middleware, microcode, hardware description language, or otherwise.

Accordingly, in one or more example embodiments, the functions described may be implemented in hardware, software, or any combination thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can comprise a random-access memory (RAM), a read-only memory (ROM), an electrically erasable programmable ROM (EEPROM), optical disk storage, magnetic disk storage, other magnetic storage devices, combinations of the aforementioned types of computer-readable media, or any other medium that can be used to store computer executable code in the form of instructions or data structures that can be accessed by a computer.

FIG. 1 is a diagram illustrating an example of a wireless communications system and an access network 100. The wireless communications system (also referred to as a wireless wide area network (WWAN)) includes base stations 102, UEs 104, and an Evolved Packet Core (EPC) 160. The base stations 102 may include macro cells (high power cellular base station) and/or small cells (low power cellular base station). The macro cells include base stations. The small cells include femtocells, picocells, and microcells.

The base stations 102 (collectively referred to as Evolved Universal Mobile Telecommunications System (UMTS) Terrestrial Radio Access Network (E-UTRAN)) interface with the EPC 160 through backhaul links 132 (e.g., S1 interface). In addition to other functions, the base stations 102 may perform one or more of the following functions: transfer of user data, radio channel ciphering and deciphering, integrity protection, header compression, mobility control functions (e.g., handover, dual connectivity), inter-cell interference coordination, connection setup and release, load balancing, distribution for non-access stratum (NAS) messages, NAS node selection, synchronization, radio access network (RAN) sharing, multimedia broadcast multicast service (MBMS), subscriber and equipment trace, RAN information management (RIM), paging, positioning, and delivery of warning messages. The base stations 102 may communicate directly or indirectly (e.g., through the EPC 160) with each other over backhaul links 134 (e.g., X2 interface). The backhaul links 134 may be wired or wireless.

The base stations 102 may wirelessly communicate with the UEs 104. Each of the base stations 102 may provide communication coverage for a respective geographic coverage area 110. There may be overlapping geographic coverage areas 110. For example, the small cell 102' may have a coverage area 110' that overlaps the coverage area 110 of one or more macro base stations 102. A network that includes both small cell and macro cells may be known as a heterogeneous network. A heterogeneous network may also include Home Evolved Node Bs (eNBs) (HeNBs), which may provide service to a restricted group known as a closed subscriber group (CSG). The communication links 120 between the base stations 102 and the UEs 104 may include uplink (UL) (also referred to as reverse link) transmissions from a UE 104 to a base station 102 and/or downlink (DL) (also referred to as forward link) transmissions from a base station 102 to a UE 104. The communication links 120 may use multiple-input and multiple-output (MIMO) antenna technology, including spatial multiplexing, beamforming, and/or transmit diversity. The communication links may be through one or more carriers. The base stations 102/UEs 104 may use spectrum up to Y MHz (e.g., 5, 10, 15, 20, 100 MHz) bandwidth per carrier allocated in a carrier aggregation of up to a total of Yx MHz (x component carriers) used for transmission in each direction. The carriers may or may not be adjacent to each other. Allocation of carriers may be asymmetric with respect to DL and UL (e.g., more or less carriers may be allocated for DL than for UL). The component carriers may include a primary component carrier and one or more secondary component carriers. A primary component carrier may be referred to as a primary cell (PCell) and a secondary component carrier may be referred to as a secondary cell (SCell).

The wireless communications system may further include a Wi-Fi access point (AP) 150 in communication with Wi-Fi stations (STAs) 152 via communication links 154 in a 5 GHz unlicensed frequency spectrum. When communicating in an unlicensed frequency spectrum, the STAs 152/AP 150 may perform a clear channel assessment (CCA) prior to communicating in order to determine whether the channel is available.

The small cell 102' may operate in a licensed and/or an unlicensed frequency spectrum. When operating in an unlicensed frequency spectrum, the small cell 102' may employ NR and use the same 5 GHz unlicensed frequency spectrum as used by the Wi-Fi AP 150. The small cell 102', employing NR in an unlicensed frequency spectrum, may boost coverage to and/or increase capacity of the access network.

The gNodeB (gNB) 180 may operate in millimeter wave (mmW) frequencies and/or near mmW frequencies in communication with the UE 104. When the gNB 180 operates in mmW or near mmW frequencies, the gNB 180 may be referred to as an mmW base station. Extremely high frequency (EHF) is part of the RF in the electromagnetic spectrum. EHF has a range of 30 GHz to 300 GHz and a wavelength between 1 millimeter and 10 millimeters. Radio waves in the band may be referred to as a millimeter wave. Near mmW may extend down to a frequency of 3 GHz with a wavelength of 100 millimeters. The super high frequency (SHF) band extends between 3 GHz and 30 GHz, also referred to as centimeter wave. Communications using the mmW/near mmW radio frequency band has extremely high path loss and a short range. The mmW base station 180 may utilize beamforming 184 with the UE 104 to compensate for the extremely high path loss and short range.

The EPC 160 may include a Mobility Management Entity (MME) 162, other MMEs 164, a Serving Gateway 166, a Multimedia Broadcast Multicast Service (MBMS) Gateway 168, a Broadcast Multicast Service Center (BM-SC) 170, and a Packet Data Network (PDN) Gateway 172. The MME 162 may be in communication with a Home Subscriber Server (HSS) 174. The MME 162 is the control node that processes the signaling between the UEs 104 and the EPC 160. Generally, the MME 162 provides bearer and connection management. All user Internet protocol (IP) packets are transferred through the Serving Gateway 166, which itself is connected to the PDN Gateway 172. The PDN Gateway 172 provides UE IP address allocation as well as other functions. The PDN Gateway 172 and the BM-SC 170 are connected to the IP Services 176. The IP Services 176 may include the Internet, an intranet, an IP Multimedia Subsystem (IMS), a PS Streaming Service (PSS), and/or other IP services. The BM-SC 170 may provide functions for MBMS user service provisioning and delivery. The BM-SC 170 may serve as an entry point for content provider MBMS transmission, may be used to authorize and initiate MBMS Bearer Services within a public land mobile network (PLMN), and may be used to schedule MBMS transmissions. The MBMS Gateway 168 may be used to distribute MBMS traffic to the base stations 102 belonging to a Multicast Broadcast Single Frequency Network (MBSFN) area broadcasting a particular service, and may be responsible for session management (start/stop) and for collecting eMBMS related charging information.

The base station may also be referred to as a gNB, Node B, evolved Node B (eNB), an access point, a base transceiver station, a radio base station, a radio transceiver, a transceiver function, a basic service set (BSS), an extended service set (ESS), or some other suitable terminology. The base station 102 provides an access point to the EPC 160 for a UE 104. Examples of UEs 104 include a cellular phone, a smart phone, a session initiation protocol (SIP) phone, a laptop, a personal digital assistant (PDA), a satellite radio, a global positioning system, a multimedia device, a video device, a digital audio player (e.g., MP3 player), a camera, a game console, a tablet, a smart device, a wearable device, a vehicle, an electric meter, a gas pump, a toaster, or any other similar functioning device. Some of the UEs 104 may be referred to as IoT devices (e.g., parking meter, gas pump, toaster, vehicles, etc.). The UE 104 may also be referred to as a station, a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a user agent, a mobile client, a client, or some other suitable terminology.

Figure 2B:
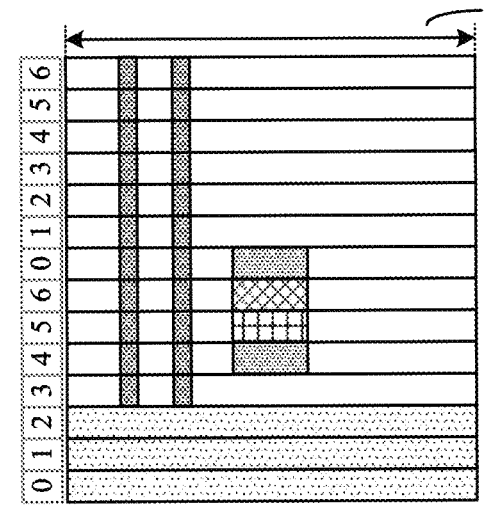
FIGS. 2A, 2B, 2C, and 2D are diagrams illustrating examples of a DL frame structure, DL channels within the DL frame structure, an UL frame structure, and UL channels within the UL frame structure, respectively.
Figure 2D:
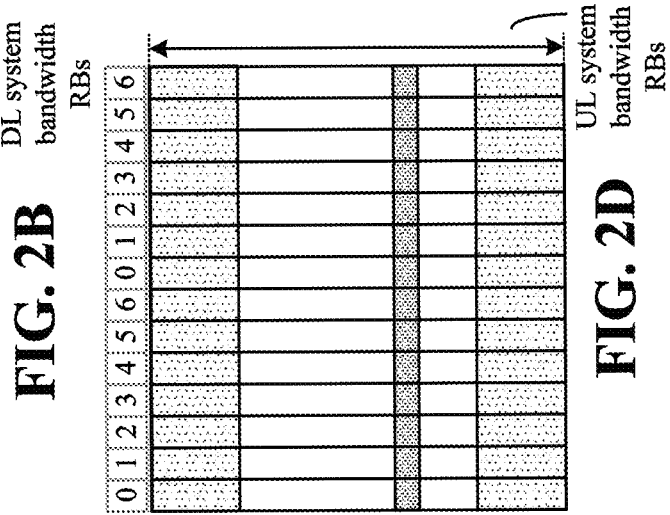
Figure 2A:
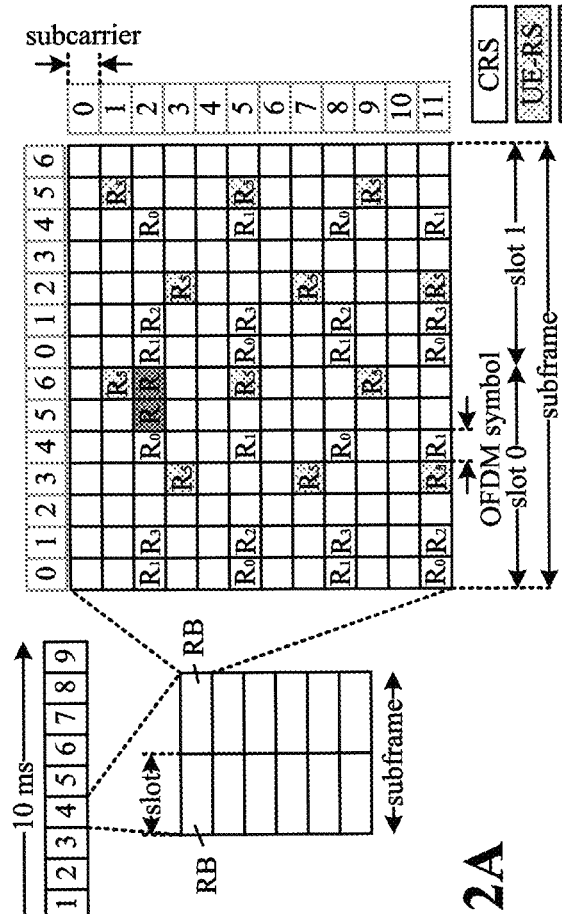
Figure 2C:
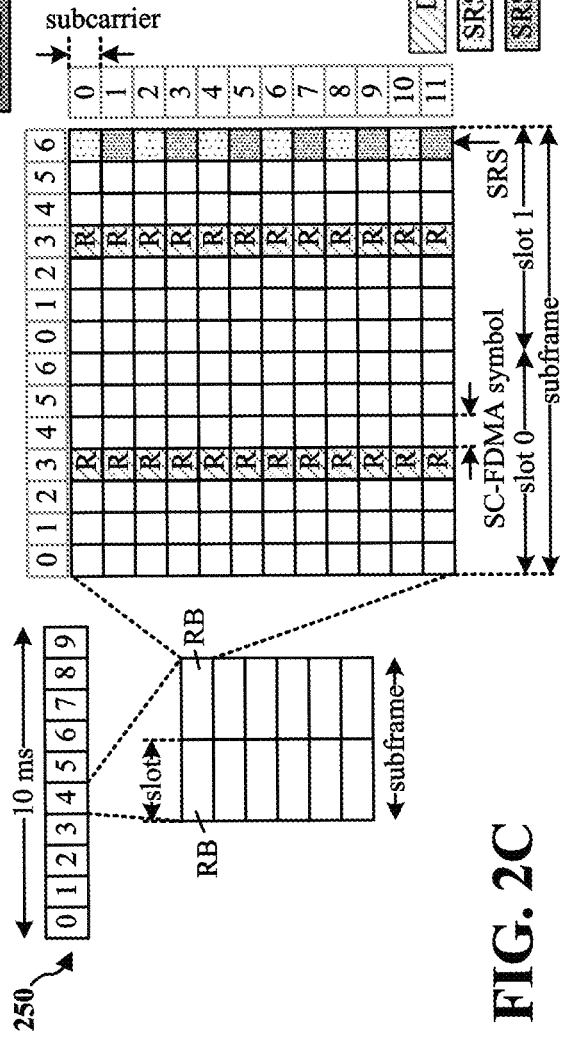

FIG. 2A is a diagram 200 illustrating an example of a DL frame structure. FIG. 2B is a diagram 230 illustrating an example of channels within the DL frame structure. FIG. 2C is a diagram 250 illustrating an example of an UL frame structure. FIG. 2D is a diagram 280 illustrating an example of channels within the UL frame structure. Other wireless communication technologies may have a different frame structure and/or different channels. A frame (10 ms) may be divided into 10 equally sized subframes. Each subframe may include two consecutive time slots. A resource grid may be used to represent the two time slots, each time slot including one or more time concurrent resource blocks (RBs) (also referred to as physical RBs (PRBs)). The resource grid is divided into multiple resource elements (REs). For a normal cyclic prefix, an RB contains 12 consecutive subcarriers in the frequency domain and 7 consecutive symbols (for DL, OFDM symbols; for UL, SC-FDMA symbols) in the time domain, for a total of 84 REs. For an extended cyclic prefix, an RB contains 12 consecutive subcarriers in the frequency domain and 6 consecutive symbols in the time domain, for a total of 72 REs. The number of bits carried by each RE depends on the modulation scheme.

As illustrated in FIG. 2A, some of the REs carry DL reference (pilot) signals (DL-RS) for channel estimation at the UE. The DL-RS may include cell-specific reference signals (CRS) (also sometimes called common RS), UE-specific reference signals (UE-RS), and channel state information reference signals (CSI-RS). FIG. 2A illustrates CRS for antenna ports 0, 1, 2, and 3 (indicated as R0, R1, R2, and R3, respectively), UE-RS for antenna port 5 (indicated as R5), and CSI-RS for antenna port 15 (indicated as R). FIG. 2B illustrates an example of various channels within a DL subframe of a frame. The physical control format indicator channel (PCFICH) is within symbol 0 of slot 0, and carries a control format indicator (CFI) that indicates whether the physical downlink control channel (PDCCH) occupies 1, 2, or 3 symbols (FIG. 2B illustrates a PDCCH that occupies 3 symbols). The PDCCH carries downlink control information (DCI) within one or more control channel elements (CCEs), each CCE including nine RE groups (REGs), each REG including four consecutive REs in an OFDM symbol. A UE may be configured with a UE-specific enhanced PDCCH (ePDCCH) that also carries DCI. The ePDCCH may have 2, 4, or 8 RB pairs (FIG. 2B shows two RB pairs, each subset including one RB pair). The physical hybrid automatic repeat request (ARQ) (HARQ) indicator channel (PHICH) is also within symbol 0 of slot 0 and carries the HARQ indicator (HI) that indicates HARQ acknowledgement (ACK)/negative ACK (NACK) feedback based on the physical uplink shared channel (PUSCH). The primary synchronization channel (PSCH) may be within symbol 6 of slot 0 within subframes 0 and 5 of a frame. The PSCH carries a primary synchronization signal (PSS) that is used by a UE to determine subframe/symbol timing and a physical layer identity. The secondary synchronization channel (SSCH) may be within symbol 5 of slot 0 within subframes 0 and 5 of a frame. The SSCH carries a secondary synchronization signal (SSS) that is used by a UE to determine a physical layer cell identity group number and radio frame timing. Based on the physical layer identity and the physical layer cell identity group number, the UE can determine a physical cell identifier (PCI). Based on the PCI, the UE can determine the locations of the aforementioned DL-RS. The physical broadcast channel (PBCH), which carries a master information block (MIB), may be logically grouped with the PSCH and SSCH to form a synchronization signal (SS) block. The MIB provides a number of RBs in the DL system bandwidth, a PHICH configuration, and a system frame number (SFN). The physical downlink shared channel (PDSCH) carries user data, broadcast system information not transmitted through the PBCH such as system information blocks (SIBs), and paging messages.

As illustrated in FIG. 2C, some of the REs carry demodulation reference signals (DM-RS) for channel estimation at the base station. The UE may additionally transmit sounding reference signals (SRS) in the last symbol of a subframe. The SRS may have a comb structure, and a UE may transmit SRS on one of the combs. The SRS may be used by a base station for channel quality estimation to enable frequency-dependent scheduling on the UL. FIG. 2D illustrates an example of various channels within an UL subframe of a frame. A physical random access channel (PRACH) may be within one or more subframes within a frame based on the PRACH configuration. The PRACH may include six consecutive RB pairs within a subframe. The PRACH allows the UE to perform initial system access and achieve UL synchronization. A physical uplink control channel (PUCCH) may be located on edges of the UL system bandwidth. The PUCCH carries uplink control information (UCI), such as scheduling requests, a channel quality indicator (CQI), a precoding matrix indicator (PMI), a rank indicator (RI), and HARQ ACK/NACK feedback. The PUSCH carries data, and may additionally be used to carry a buffer status report (BSR), a power headroom report (PHR), and/or UCI.

Figure 3:
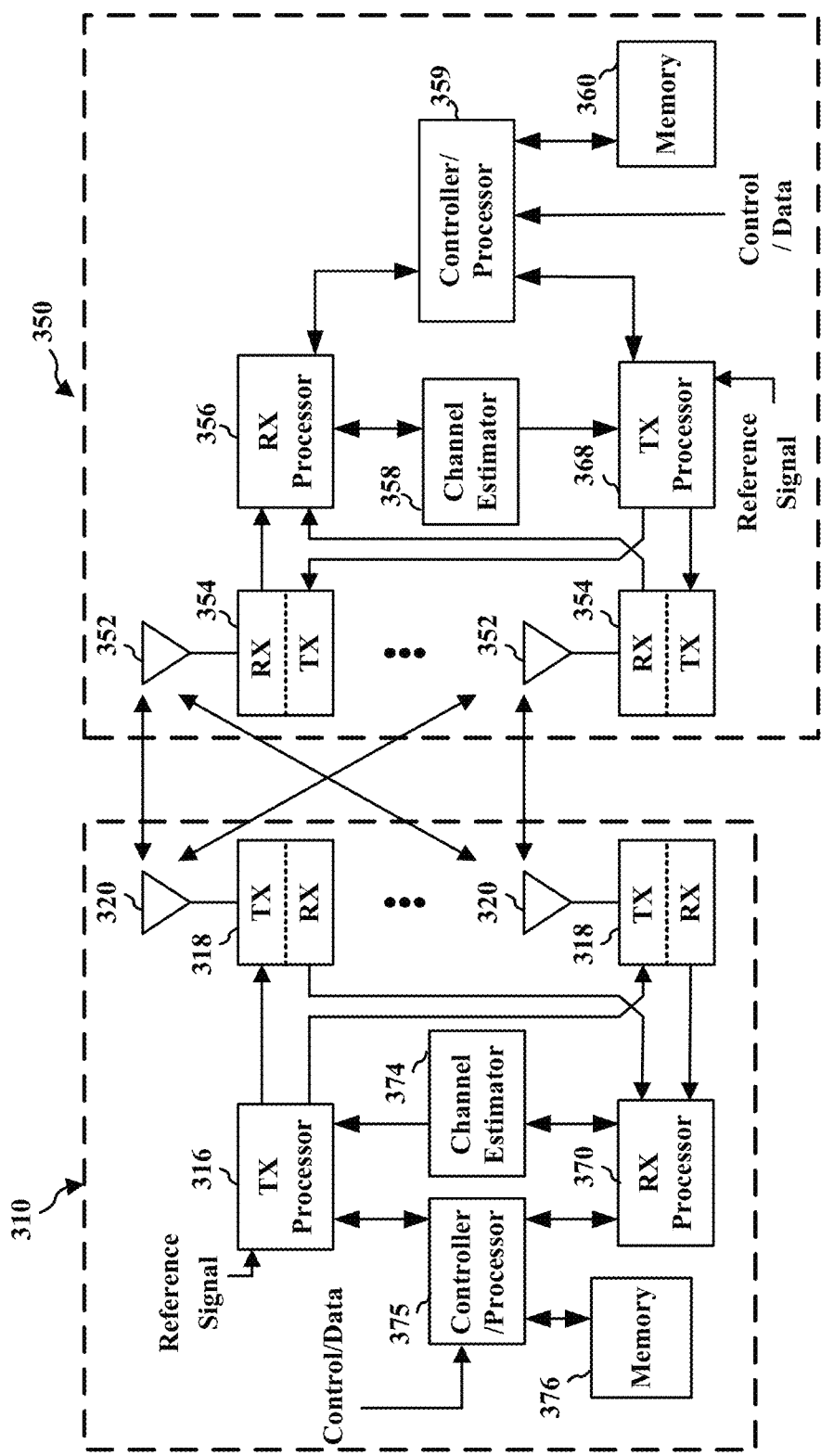
FIG. 3 is a diagram illustrating a base station in communication with a UE in an access network.

FIG. 3 is a block diagram of a base station 310 in communication with a UE 350 in an access network. In the DL, IP packets from the EPC 160 may be provided to a controller/processor 375. The controller/processor 375 implements layer 3 and layer 2 functionality. Layer 3 includes a radio resource control (RRC) layer, and layer 2 includes a packet data convergence protocol (PDCP) layer, a radio link control (RLC) layer, and a medium access control (MAC) layer. The controller/processor 375 provides RRC layer functionality associated with broadcasting of system information (e.g., MIB, SIBs), RRC connection control (e.g., RRC connection paging, RRC connection establishment, RRC connection modification, and RRC connection release), inter radio access technology (RAT) mobility, and measurement configuration for UE measurement reporting; PDCP layer functionality associated with header compression/decompression, security (ciphering, deciphering, integrity protection, integrity verification), and handover support functions; RLC layer functionality associated with the transfer of upper layer packet data units (PDUs), error correction through ARQ, concatenation, segmentation, and reassembly of RLC service data units (SDUs), re-segmentation of RLC data PDUs, and reordering of RLC data PDUs; and MAC layer functionality associated with mapping between logical channels and transport channels, multiplexing of MAC SDUs onto transport blocks (TBs), demultiplexing of MAC SDUs from TBs, scheduling information reporting, error correction through HARQ, priority handling, and logical channel prioritization.

The transmit (TX) processor 316 and the receive (RX) processor 370 implement layer 1 functionality associated with various signal processing functions. Layer 1, which includes a physical (PHY) layer, may include error detection on the transport channels, forward error correction (FEC) coding/decoding of the transport channels, interleaving, rate matching, mapping onto physical channels, modulation/demodulation of physical channels, and MIMO antenna processing. The TX processor 316 handles mapping to signal constellations based on various modulation schemes (e.g., binary phase-shift keying (BPSK), quadrature phase-shift keying (QPSK), M-phase-shift keying (M-PSK), M-quadrature amplitude modulation (M-QAM)). The coded and modulated symbols may then be split into parallel streams. Each stream may then be mapped to an OFDM subcarrier, multiplexed with a reference signal (e.g., pilot) in the time and/or frequency domain, and then combined together using an Inverse Fast Fourier Transform (IFFT) to produce a physical channel carrying a time domain OFDM symbol stream. The OFDM stream is spatially precoded to produce multiple spatial streams. Channel estimates from a channel estimator 374 may be used to determine the coding and modulation scheme, as well as for spatial processing. The channel estimate may be derived from a reference signal and/or channel condition feedback transmitted by the UE 350. Each spatial stream may then be provided to a different antenna 320 via a separate transmitter 318TX. Each transmitter 318TX may modulate an RF carrier with a respective spatial stream for transmission.

At the UE 350, each receiver 354RX receives a signal through its respective antenna 352. Each receiver 354RX recovers information modulated onto an RF carrier and provides the information to the receive (RX) processor 356. The TX processor 368 and the RX processor 356 implement layer 1 functionality associated with various signal processing functions. The RX processor 356 may perform spatial processing on the information to recover any spatial streams destined for the UE 350. If multiple spatial streams are destined for the UE 350, they may be combined by the RX processor 356 into a single OFDM symbol stream. The RX processor 356 then converts the OFDM symbol stream from the time-domain to the frequency domain using a Fast Fourier Transform (FFT). The frequency domain signal comprises a separate OFDM symbol stream for each subcarrier of the OFDM signal. The symbols on each subcarrier, and the reference signal, are recovered and demodulated by determining the most likely signal constellation points transmitted by the base station 310. These soft decisions may be based on channel estimates computed by the channel estimator 358. The soft decisions are then decoded and deinterleaved to recover the data and control signals that were originally transmitted by the base station 310 on the physical channel. The data and control signals are then provided to the controller/processor 359, which implements layer 3 and layer 2 functionality.

The controller/processor 359 can be associated with a memory 360 that stores program codes and data. The memory 360 may be referred to as a computer-readable medium. In the UL, the controller/processor 359 provides demultiplexing between transport and logical channels, packet reassembly, deciphering, header decompression, and control signal processing to recover IP packets from the EPC 160. The controller/processor 359 is also responsible for error detection using an ACK and/or NACK protocol to support HARQ operations.

Similar to the functionality described in connection with the DL transmission by the base station 310, the controller/processor 359 provides RRC layer functionality associated with system information (e.g., MIB, SIBs) acquisition, RRC connections, and measurement reporting; PDCP layer functionality associated with header compression/decompression, and security (ciphering, deciphering, integrity protection, integrity verification); RLC layer functionality associated with the transfer of upper layer PDUs, error correction through ARQ, concatenation, segmentation, and reassembly of RLC SDUs, re-segmentation of RLC data PDUs, and reordering of RLC data PDUs; and MAC layer functionality associated with mapping between logical channels and transport channels, multiplexing of MAC SDUs onto TBs, demultiplexing of MAC SDUs from TBs, scheduling information reporting, error correction through HARQ, priority handling, and logical channel prioritization.

Channel estimates derived by a channel estimator 358 from a reference signal or feedback transmitted by the base station 310 may be used by the TX processor 368 to select the appropriate coding and modulation schemes, and to facilitate spatial processing. The spatial streams generated by the TX processor 368 may be provided to different antenna 352 via separate transmitters 354TX. Each transmitter 354TX may modulate an RF carrier with a respective spatial stream for transmission. The UL transmission is processed at the base station 310 in a manner similar to that described in connection with the receiver function at the UE 350. Each receiver 318RX receives a signal through its respective antenna 320. Each receiver 318RX recovers information modulated onto an RF carrier and provides the information to a RX processor 370.

The controller/processor 375 can be associated with a memory 376 that stores program codes and data. The memory 376 may be referred to as a computer-readable medium. In the UL, the controller/processor 375 provides demultiplexing between transport and logical channels, packet reassembly, deciphering, header decompression, control signal processing to recover IP packets from the UE 350. IP packets from the controller/processor 375 may be provided to the EPC 160. The controller/processor 375 is also responsible for error detection using an ACK and/or NACK protocol to support HARQ operations.

New radio (NR) may refer to radios configured to operate according to a new air interface (e.g., other than Orthogonal Frequency Divisional Multiple Access (OFDMA)-based air interfaces) or fixed transport layer (e.g., other than Internet Protocol (IP)). NR may utilize OFDM with a cyclic prefix (CP) on the uplink and downlink and may include support for half-duplex operation using time division duplexing (TDD). NR may include Enhanced Mobile Broadband (eMBB) service targeting wide bandwidth (e.g. 80 MHz beyond), millimeter wave (mmW) targeting high carrier frequency (e.g. 60 GHz), massive MTC (mMTC) targeting non-backward compatible MTC techniques, and/or mission critical targeting ultra-reliable low latency communications (URLLC) service.

A single component carrier bandwidth of 100 MHZ may be supported. In one example, NR resource blocks (RBs) may span 12 sub-carriers with a sub-carrier bandwidth of 75 kHz over a 0.1 ms duration or a bandwidth of 15 kHz over a 1 ms duration. Each radio frame may consist of 10 or 50 subframes with a length of 10 ms. Each subframe may have a length of 0.2 ms. Each subframe may indicate a link direction (i.e., DL or UL) for data transmission and the link direction for each subframe may be dynamically switched. Each subframe may include DL/UL data as well as DL/UL control data. UL and DL subframes for NR may be as described in more detail below with respect to FIGS. 6 and 7.

Beamforming may be supported and beam direction may be dynamically configured. MIMO transmissions with precoding may also be supported. MIMO configurations in the DL may support up to 8 transmit antennas with multi-layer DL transmissions up to 8 streams and up to 2 streams per UE. Multi-layer transmissions with up to 2 streams per UE may be supported. Aggregation of multiple cells may be supported with up to 8 serving cells. Alternatively, NR may support a different air interface, other than an OFDM-based interface.

The NR RAN may include a central unit (CU) and distributed units (DUs). A NR BS (e.g., gNB, 5G Node B, Node B, transmission reception point (TRP), access point (AP)) may correspond to one or multiple BSs. NR cells can be configured as access cells (ACells) or data only cells (DCells). For example, the RAN (e.g., a central unit or distributed unit) can configure the cells. DCells may be cells used for carrier aggregation or dual connectivity and may not be used for initial access, cell selection/reselection, or handover. In some cases DCells may not transmit synchronization signals (SS) in some cases DCells may transmit SS. NR BSs may transmit downlink signals to UEs indicating the cell type. Based on the cell type indication, the UE may communicate with the NR BS. For example, the UE may determine NR BSs to consider for cell selection, access, handover, and/or measurement based on the indicated cell type.

Figure 4:
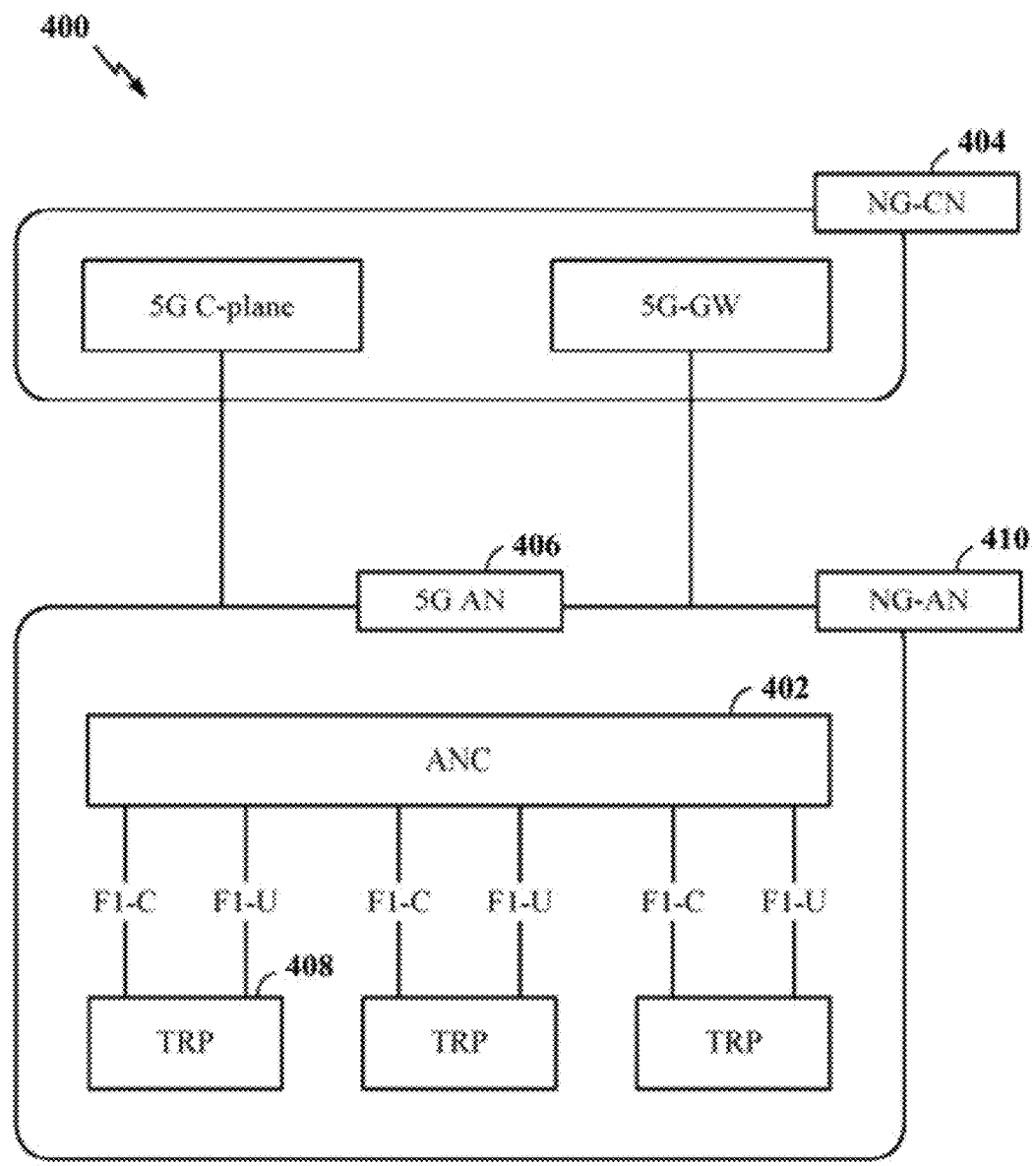
FIG. 4 illustrates an example logical architecture of a distributed access network.

FIG. 4 illustrates an example logical architecture 400 of a distributed RAN, according to aspects of the present disclosure. A 5G access node 406 may include an access node controller (ANC) 402. The ANC may be a central unit (CU) of the distributed RAN 400. The backhaul interface to the next generation core network (NG-CN) 404 may terminate at the ANC. The backhaul interface to neighboring next generation access nodes (NG-ANs) may terminate at the ANC. The ANC may include one or more TRPs 408 (which may also be referred to as BSs, NR BSs, Node Bs, 5G NBs, APs, or some other term). As described above, a TRP may be used interchangeably with "cell."

The TRPs 408 may be a distributed unit (DU). The TRPs may be connected to one ANC (ANC 402) or more than one ANC (not illustrated). For example, for RAN sharing, radio as a service (RaaS), and service specific AND deployments, the TRP may be connected to more than one ANC. A TRP may include one or more antenna ports. The TRPs may be configured to individually (e.g., dynamic selection) or jointly (e.g., joint transmission) serve traffic to a UE.

The local architecture of the distributed RAN 400 may be used to illustrate fronthaul definition. The architecture may be defined that support fronthauling solutions across different deployment types. For example, the architecture may be based on transmit network capabilities (e.g., bandwidth, latency, and/or jitter). The architecture may share features and/or components with LTE. According to aspects, the next generation AN (NG-AN) 410 may support dual connectivity with NR. The NG-AN may share a common fronthaul for LTE and NR.

The architecture may enable cooperation between and among TRPs 408. For example, cooperation may be preset within a TRP and/or across TRPs via the ANC 402. According to aspects, no inter-TRP interface may be needed/present.

According to aspects, a dynamic configuration of split logical functions may be present within the architecture of the distributed RAN 400. The PDCP, RLC, MAC protocol may be adaptably placed at the ANC or TRP.

Figure 5:
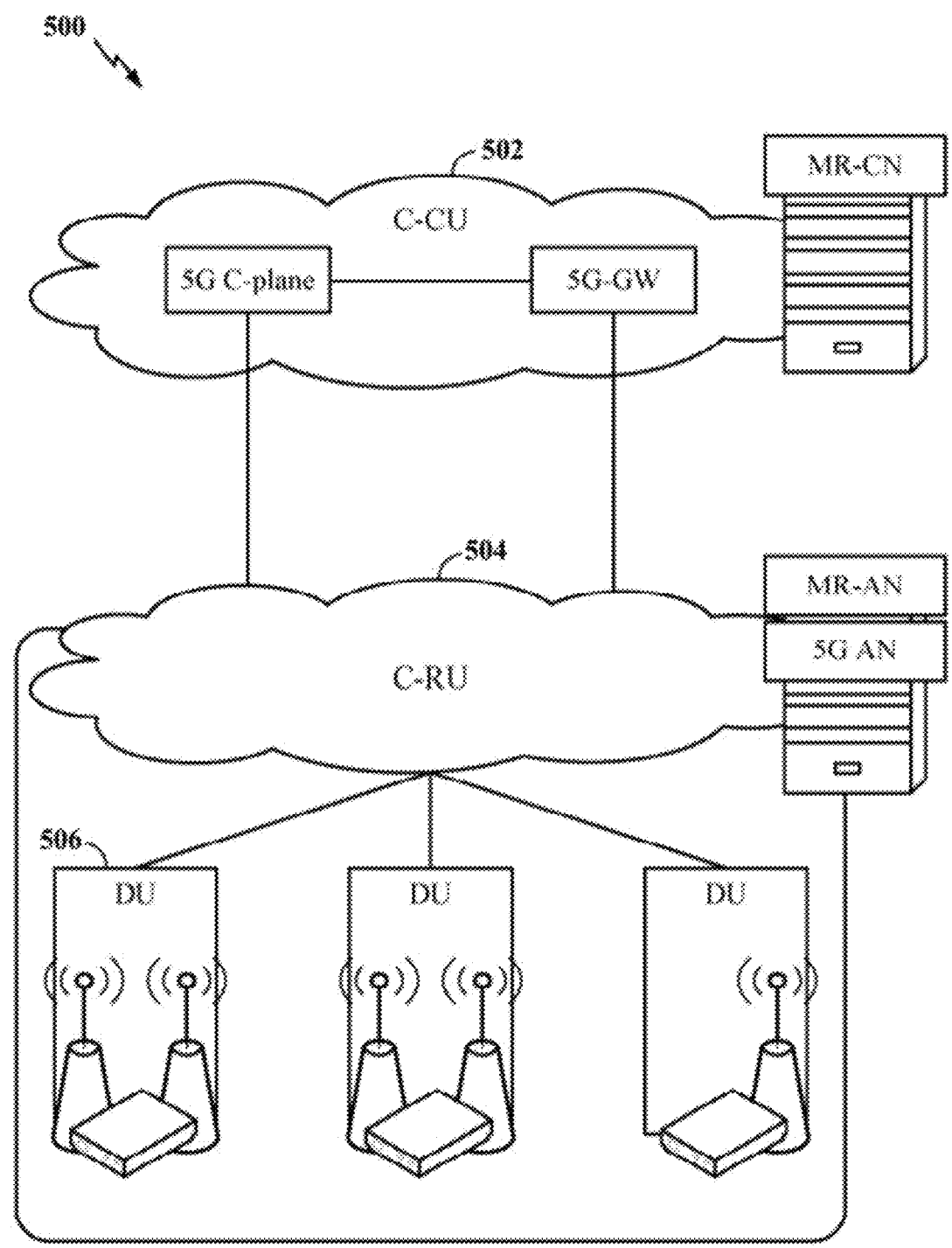
FIG. 5 illustrates an example physical architecture of a distributed access network.

FIG. 5 illustrates an example physical architecture of a distributed RAN 500, according to aspects of the present disclosure. A centralized core network unit (C-CU) 502 may host core network functions. The C-CU may be centrally deployed. C-CU functionality may be offloaded (e.g., to advanced wireless services (AWS)), in an effort to handle peak capacity. A centralized RAN unit (C-RU) 504 may host one or more ANC functions. Optionally, the C-RU may host core network functions locally. The C-RU may have distributed deployment. The C-RU may be closer to the network edge. A distributed unit (DU) 506 may host one or more TRPs. The DU may be located at edges of the network with radio frequency (RF) functionality.

Figure 6:
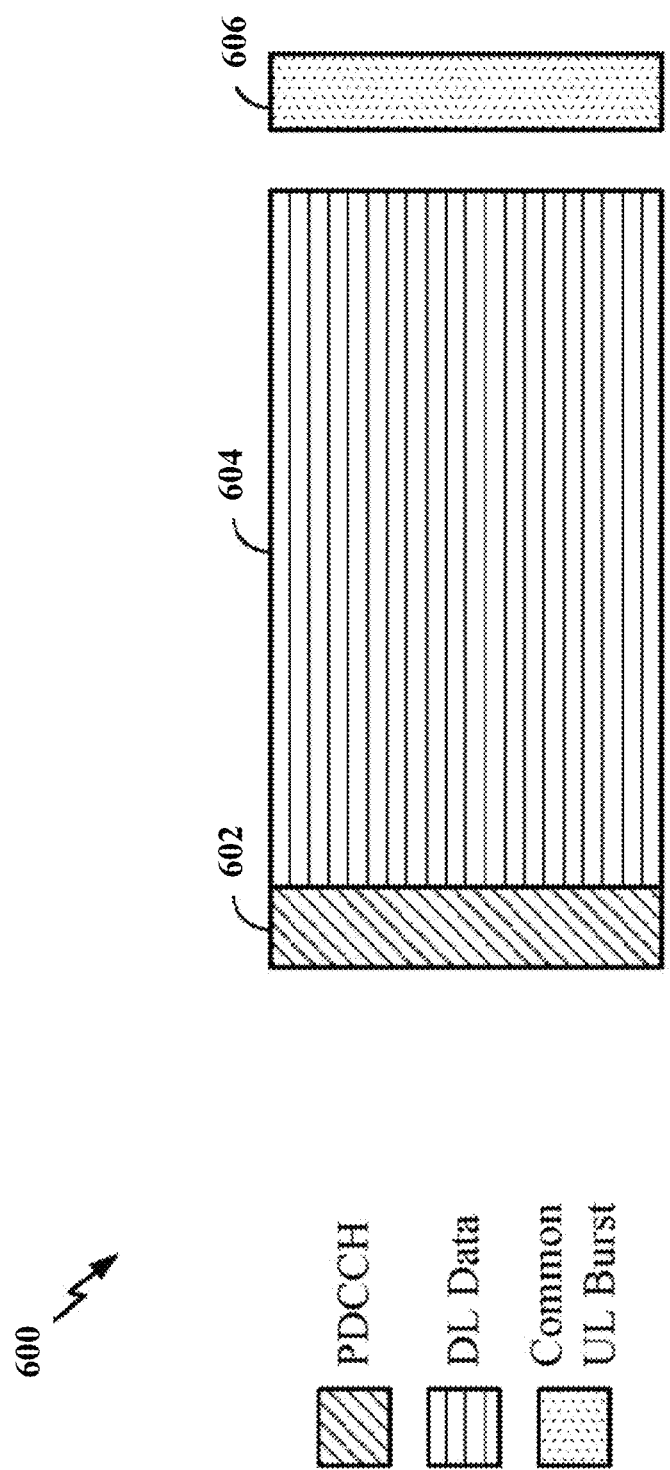
FIG. 6 is a diagram showing an example of a DL-centric subframe.

FIG. 6 is a diagram 600 showing an example of a DL-centric subframe. The DL-centric subframe may include a control portion 602. The control portion 602 may exist in the initial or beginning portion of the DL-centric subframe. The control portion 602 may include various scheduling information and/or control information corresponding to various portions of the DL-centric subframe. In some configurations, the control portion 602 may be a physical DL control channel (PDCCH), as indicated in FIG. 6. The DL-centric subframe may also include a DL data portion 604. The DL data portion 604 may sometimes be referred to as the payload of the DL-centric subframe. The DL data portion 604 may include the communication resources utilized to communicate DL data from the scheduling entity (e.g., UE or BS) to the subordinate entity (e.g., UE). In some configurations, the DL data portion 604 may be a physical DL shared channel (PDSCH).

The DL-centric subframe may also include a common UL portion 606. The common UL portion 606 may sometimes be referred to as an UL burst, a common UL burst, and/or various other suitable terms. The common UL portion 606 may include feedback information corresponding to various other portions of the DL-centric subframe. For example, the common UL portion 606 may include feedback information corresponding to the control portion 602. Non-limiting examples of feedback information may include an ACK signal, a NACK signal, a HARQ indicator, and/or various other suitable types of information. The common UL portion 606 may include additional or alternative information, such as information pertaining to random access channel (RACH) procedures, scheduling requests (SRs), and various other suitable types of information.

As illustrated in FIG. 6, the end of the DL data portion 604 may be separated in time from the beginning of the common UL portion 606. This time separation may sometimes be referred to as a gap, a guard period, a guard interval, and/or various other suitable terms. This separation provides time for the switch-over from DL communication (e.g., reception operation by the subordinate entity (e.g., UE)) to UL communication (e.g., transmission by the subordinate entity (e.g., UE)). One of ordinary skill in the art will understand that the foregoing is merely one example of a DL-centric subframe and alternative structures having similar features may exist without necessarily deviating from the aspects described herein.

Figure 7:
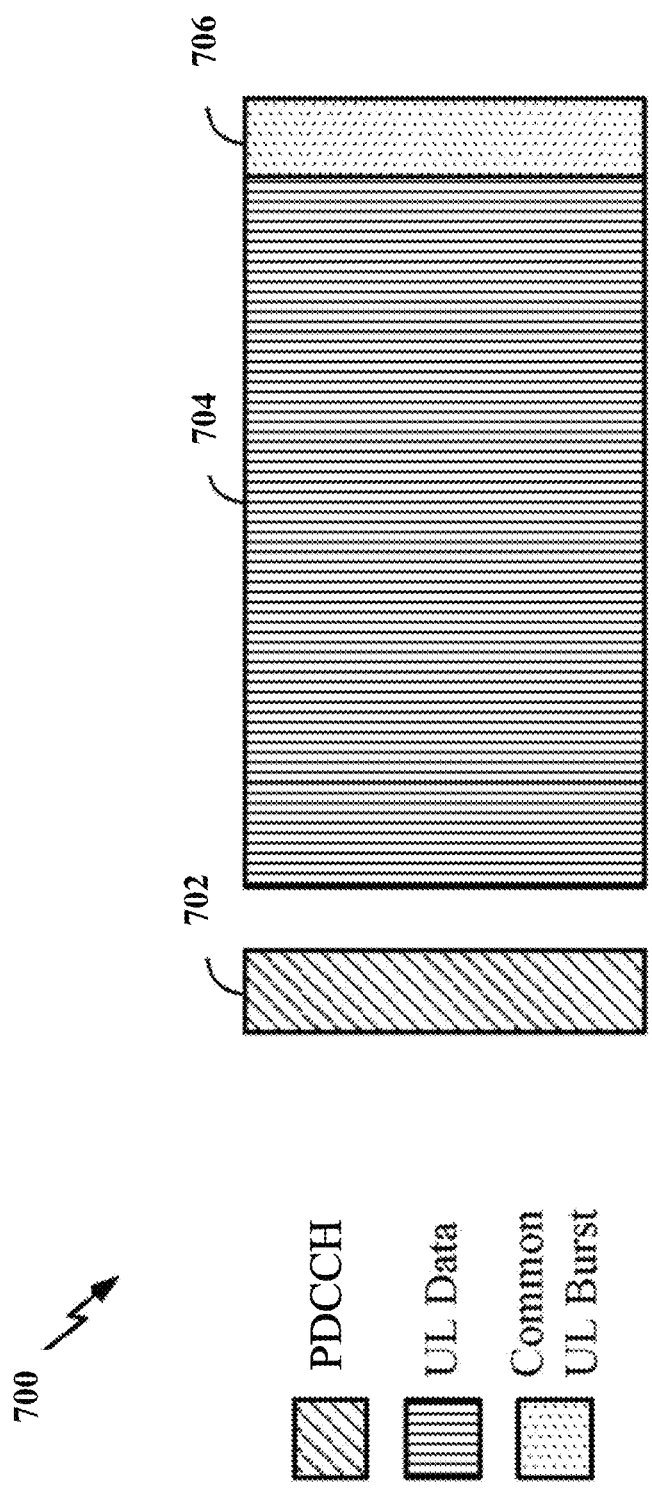
FIG. 7 is a diagram showing an example of an UL-centric subframe.

FIG. 7 is a diagram 700 showing an example of an UL-centric subframe. The UL-centric subframe may include a control portion 702. The control portion 702 may exist in the initial or beginning portion of the UL-centric subframe. The control portion 702 in FIG. 7 may be similar to the control portion 602 described above with reference to FIG. 6. The UL-centric subframe may also include an UL data portion 704. The UL data portion 704 may sometimes be referred to as the pay load of the UL-centric subframe. The UL portion may refer to the communication resources utilized to communicate UL data from the subordinate entity (e.g., UE) to the scheduling entity (e.g., UE or BS). In some configurations, the control portion 702 may be a physical DL control channel (PDCCH).

As illustrated in FIG. 7, the end of the control portion 702 may be separated in time from the beginning of the UL data portion 704. This time separation may sometimes be referred to as a gap, guard period, guard interval, and/or various other suitable terms. This separation provides time for the switch-over from DL communication (e.g., reception operation by the scheduling entity) to UL communication (e.g., transmission by the scheduling entity). The UL-centric subframe may also include a common UL portion 706. The common UL portion 706 in FIG. 7 may be similar to the common UL portion 706 described above with reference to FIG. 7. The common UL portion 706 may additionally or alternatively include information pertaining to channel quality indicator (CQI), sounding reference signals (SRSs), and various other suitable types of information. One of ordinary skill in the art will understand that the foregoing is merely one example of an UL-centric subframe and alternative structures having similar features may exist without necessarily deviating from the aspects described herein.

In some circumstances, two or more subordinate entities (e.g., UEs) may communicate with each other using sidelink signals. Real-world applications of such sidelink communications may include public safety, proximity services, UE-to-network relaying, vehicle-to-vehicle (V2V) communications, Internet of Everything (IoE) communications, IoT communications, mission-critical mesh, and/or various other suitable applications. Generally, a sidelink signal may refer to a signal communicated from one subordinate entity (e.g., UE1) to another subordinate entity (e.g., UE2) without relaying that communication through the scheduling entity (e.g., UE or BS), even though the scheduling entity may be utilized for scheduling and/or control purposes. In some examples, the sidelink signals may be communicated using a licensed spectrum (unlike wireless local area networks, which typically use an unlicensed spectrum).

Figure 8:
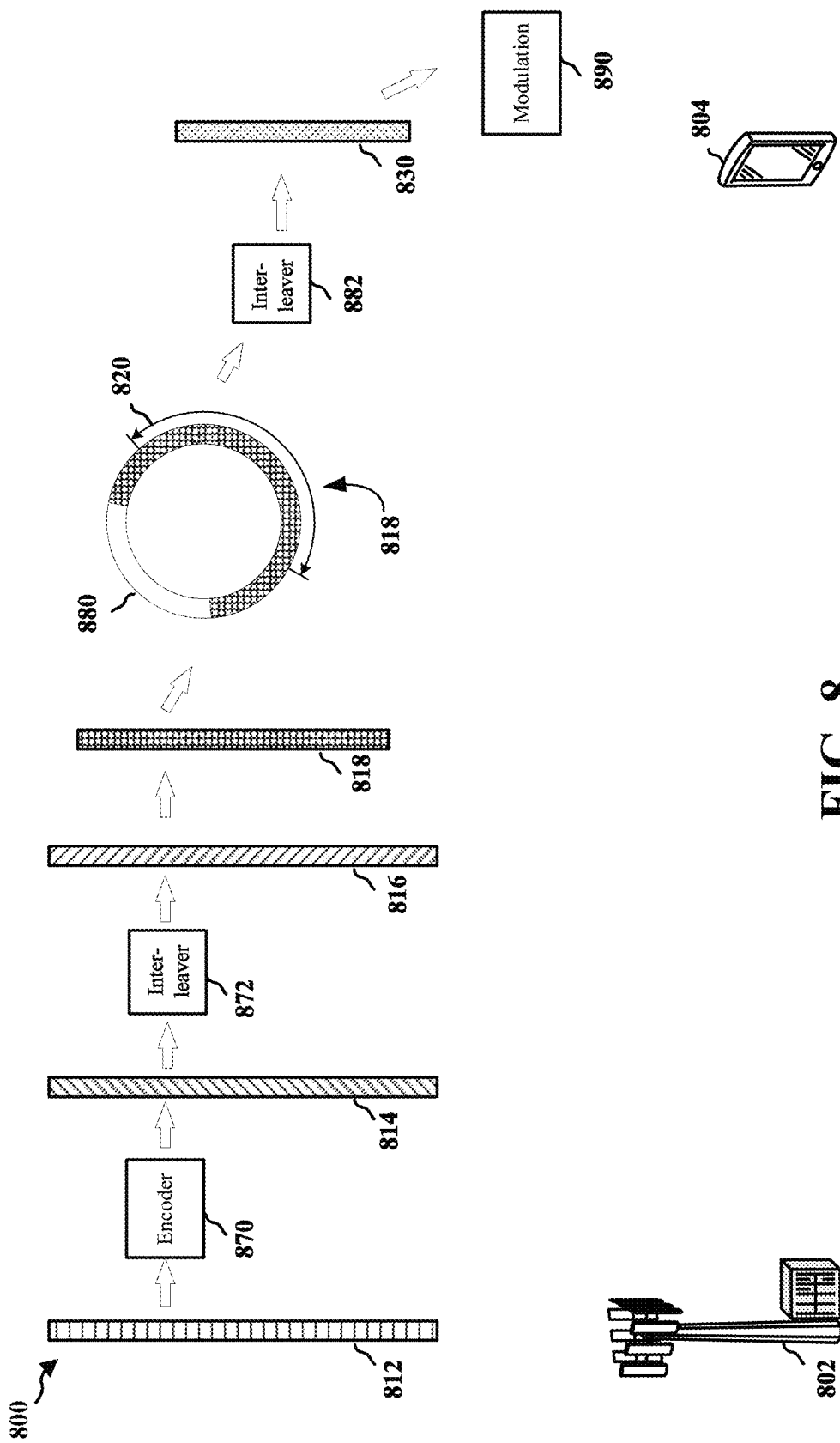
FIG. 8 is a diagram illustrating communications between a base station and UE.

FIG. 8 is a diagram 800 illustrating communications between a base station 802 and a UE 804. In this example, the base station 802 generates a sequence of information bits 812. For example, the information bits 812 may be for a PDCCH. The sequence of information bits 812 is sent to a polar encoder 870, which generates a sequence of encoded bits 814. The sequence of encoded bits 814 is sent to a rate-matching interleaver 872, which interleaves the sequence of encoded bits 814 to generate a sequence of encoded bits 816. The base station 802 further manipulates the sequence of encoded bits 816. For example, the base station 802 can puncture, shorten, and repeating one or more parts of the sequence of encoded bits 816. As such, through manipulation, the base station 802 obtains a sequence of encoded bits 818. The base station 802 places the sequence of encoded bits 818 in a circular buffer 880.

In certain configurations, the base station 802 selects a section of bits 820 from the sequence of encoded bits 818 stored in the circular buffer 880 and sends the section of bits 820 to a channel bit interleaver 882. In particular, the section of bits 820 may contain consecutive bits to an extent that matches the number of available resource elements in the resource blocks assigned for the transmission. The channel bit interleaver 882 interleaves the section of bits 820 and generates a sequence of encoded bits 830. Bits from the sequence of encoded bits 830 are then sent to the modulation component 890 to be mapped to modulation bits of one or more symbols. The base station 802 then transmits the symbols to the UE 804.

Although in this disclosure examples are given referring to the base station 802, it is noted that the UE 804 can perform the same operations described herein.

In one example, the channel bit interleaver 882 is a triangular interleaver. The triangular interleaver has a size Q as represented by the matrix:

$$\begin{bmatrix} y_0 & y_1 & \cdots & y_{P-2} & y_{P-1} \\ y_P & y_{P+1} & \cdots & y_{2P-2} & \\ \cdots & \cdots & \cdots & & \\ y_{Q-3} & y_{Q-2} & & & \\ y_{Q-1} & & & & \end{bmatrix}$$

$y_n$ represents a position in the interleaver for holding a bit, n being an integer from 0 to Q−1. Accordingly, the base station 802 writes up to Q bits from the section of bits 820 to the matrix of the triangular interleaver row by row. The base station 802 then reads bits out of the matrix column by column. Further, when the bit number of the section of bits 820 is less than Q bits, the null bits can be skipped.

In another example, the interleaving effects provided by the rate-matching interleaver 872 are considered, so that reduced index mapping complexity and data buffering cost can be realized. In particular, in this example, the channel bit interleaver 882 is block interleaver. In some cases, the block interleaver may have a size smaller than a codeword. A block interleaver having a size B and a depth d can be represented by the matrix:

$$\begin{bmatrix} y_0 & y_1 & \cdots & y_{d-1} \\ y_d & y_{d+1} & \cdots & y_{2d-2} \\ \vdots & \vdots & \ddots & \vdots \\ y_{B-d} & y_{B-d+1} & \cdots & y_{B-1} \end{bmatrix}$$

$y_n$ represents a position in the interleaver for holding a bit, n being an integer from 0 to B−1. The base station 802 writes up to B bits from the section of bits 820 to the matrix of the block interleaver row by row. The base station 802 then reads bits out of the matrix column by column. The block interleaver may achieve a higher performance when the depth is chosen to be a proper prime number, e.g., 5 or 11, or when the interleaver parameter is adapted in accordance with a modulation order of the symbols used for transmission. Because of the regular row and column size in a block interleaver, the read/write access is simple and can ease high-throughput implementations. In certain configurations, the channel bit interleaver 882 has a size up to 108 bits or a size up to 216 bits.

Figure 9:
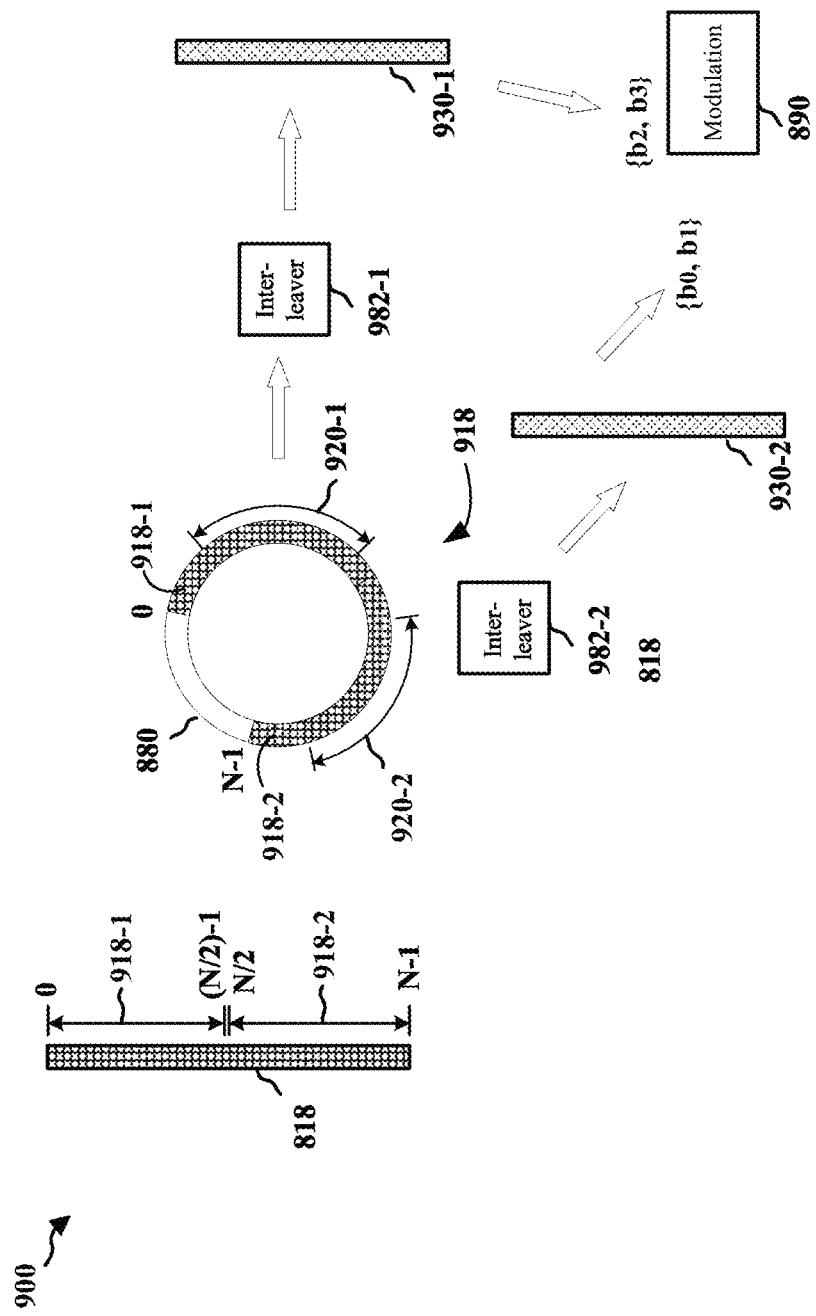
FIG. 9 is another diagram illustrating communications between a base station and UE.

FIG. 9 is another diagram 900 illustrating communication between the base station 802 and the UE 804. In particular, in this example, the sequence of encoded bits 818 output from the polar encoder 870 has N bits and can be indexed from 0 to N−1 consecutively. Further, in the sequence of encoded bits 818, a particular encoded bit has a higher importance than that of another encoded bit of a lower index. For example, the bit with an index of N/2 is more important than the bit with an index of (N/2)−1. In certain circumstances, there is an exception for those bits corresponding to zero input bits for shortening.

In one technique, after being placed in the circular buffer 880, the sequence of encoded bits 818 is evenly divided into a part 918-1 and a part 918-2. The part 918-1 contains bits with indices from 0 to (N/2)−1, and the part 918-2 contains bits with indices from N/2 to N−1. As described supra, each bit of the part 918-2 has a higher importance than any bit in the part 918-1. The base station 802 may select a section 920-1 from the part 918-1 and a section 920-2 from the part 918-2. In particular, the section 920-1 and the section 920-2 may contain the same number of consecutive bits. The total bit number of the section 920-1 and the section 920-2 correspond to the number of available resource elements in the resource blocks assigned for the transmission.

The base station 802 sends the section 920-1 to a channel bit interleaver 982-1 and the section 920-2 to a channel bit interleaver 982-2. Accordingly, the channel bit interleaver 982-1 generates a sequence of encoded bits 930-1, and the channel bit interleaver 982-1 generates a sequence of encoded bits 930-2.

Further, in this example, the base station 802 may employ 16 QAM symbols to transmit encoded bits. A 16 QAM symbol carries 4 modulation bits in order: $\{b_0,b_1,b_2,b_3\}$. $\{b_0,b_1\}$ have higher reliability than $\{b_2,b_3\}$. As described supra, the part 918-2 is more important than the part 918-1. Accordingly, the sequence of encoded bits 930-2 contains encoded bits that are more important than the sequence of encoded bits 930-1. The base station 802 selects 2 encoded bits from the sequence of encoded bits 930-1 and sends the 2 encoded bits to the modulation component 890. The base station 802 also selects 2 encoded bits from the sequence of encoded bits 930-2 and sends the 2 encoded bits to the modulation component 890. The modulation component 890 maps 2 encoded bits selected from the sequence of encoded bits 930-2 to $\{b_0,b_1\}$ of a particular 16 QAM symbol, and maps 2 encoded bits selected from the sequence of encoded bits 930-1 to $\{b_2,b_3\}$ of the particular 16 QAM symbol. As such, more important bits from the sequence of encoded bits 930-2 are mapped to the more reliable bits $\{b_0,b_1\}$.

In certain configurations, the channel bit interleaver 982-1 and the channel bit interleaver 982-2 may have the same size and depth. Further, the channel bit interleaver 982-1 and channel bit interleaver 982-2 may have identical configurations or substantially same configurations.

In certain configurations, the channel bit interleaver 982-1 and the channel bit interleaver 982-2 may have different configurations. In certain configurations, the depth of the channel bit interleaver 982-1 is the same as that of the channel bit interleaver 982-2, but the read column order of the channel bit interleaver 982-1 is reversed of the read column order of the channel bit interleaver 982-2.

In certain configurations, the channel bit interleaver 982-1 can read the section 920-1 in one direction (e.g., from lower index to higher index), while the channel bit interleaver 982-2 can read the section 920-2 in the opposite direction (e.g., from higher index to lower index).

In certain configurations, the channel bit interleaver 982-1 and the channel bit interleaver 982-2 each have a size up to 216 bits. Further, with respect to PDCCH settings, the size of channel bit interleaving may be matched to an integer number of Control-Channel Elements (CCEs). In particular, the size of 2 CCEs can improve performance and latency trade-off, while the size of 1 CCE can be considered if reduced latency is prioritized.

Figure 10:
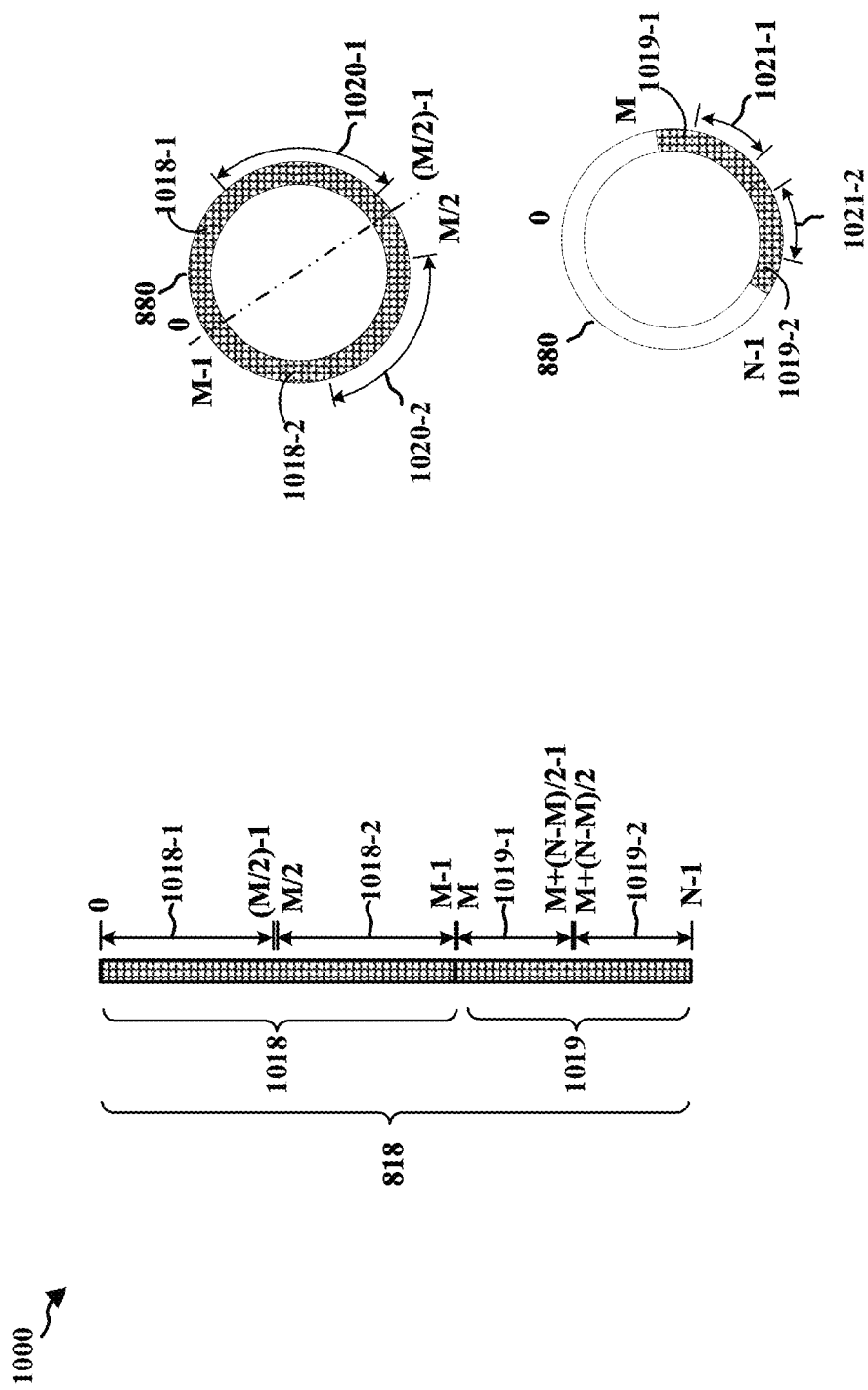
FIG. 10 is a diagram illustrating placing encoded bits in a circular buffer.

FIG. 10 is a diagram 1000 illustrating placing encoded bits in the circular buffer 880. In this example, the circular buffer 880 has a size M that is smaller than the number of bits (i.e., N) of the sequence of encoded bits 818. Accordingly, the base station 802 selects a portion 1018, which contains bits with indices from 0 to M−1, to process. The base station 802 divides the portion 1018 evenly into a part 1018-1, which contains bits with indices from 0 to (M/2)−1, and a part 1018-2, which contains bits with indices from M/2 to M−1. The part 1018-1 and the part 1018-2 are placed into the circular buffer 880. The base station 802 selects a section 1020-1 from the part 1018-1 and input the section 1020-1 to the channel bit interleaver 982-1. The base station 802 selects a section 1020-2 from the part 1018-2 and input the section 1020-2 to the channel bit interleaver 982-2. As described supra, the modulation component 890 maps 2 encoded bits from the sequence of encoded bits 930-2 output from the channel bit interleaver 982-2 to modulation bits $\{b_0, b_1\}$ of a particular 16 QAM symbol. The modulation component 890 maps 2 encoded bits from the sequence of encoded bits 930-1 output from the channel bit interleaver 982-1 to modulation bits $\{b_2, b_3\}$ of the particular 16 QAM symbol.

Subsequently, the base station 802 removes the part 1018-1 and the part 1018-2 from the circular buffer 880. The base station 802 divides the part 1019 evenly into a part 1019-1, which contains bits with indices from M to M+(N−M)/2−1, and a part 1019-2, which contains bits with indices from M+(N−M)/2 to N−1. The part 1019-1 and the part 1019-2 are placed into the circular buffer 880. The base station 802 then selects a section 1021-1 from the part 1019-1 and input the section 1021-1 to the channel bit interleaver 982-1. The base station 802 then selects a section 1021-2 from the part 1019-2 and input the section 1021-2 to the channel bit interleaver 982-2. As described supra, the modulation component 890 maps 2 encoded bits from the sequence of encoded bits 930-2 output from the channel bit interleaver 982-2 to modulation bits $\{b_0, b_1\}$ of a particular 16 QAM symbol. The modulation component 890 maps 2 encoded bits from the sequence of encoded bits 930-1 output from the channel bit interleaver 982-1 to modulation bits $\{b_2, b_3\}$ of the particular 16 QAM symbol.

Figure 11:
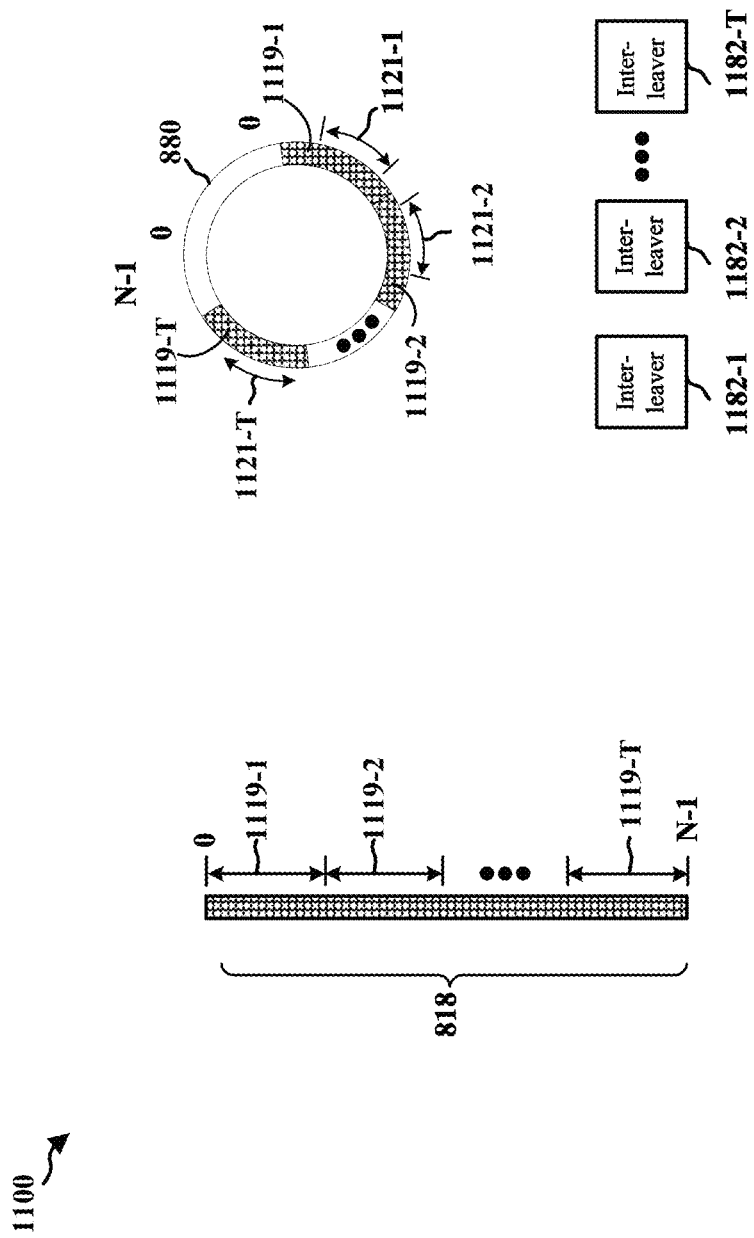
FIG. 11 is yet another diagram illustrating communications between a base station and UE.

FIG. 11 is yet another diagram 1100 illustrating communication between the base station 802 and the UE 804. In another technique, the number parallel block interleavers utilized by the base station 802 may depend on the modulation order of the symbols. The base station 802 may divide the sequence of encoded bits 818 into T parts including parts 1119-1, ..., 1119-T. In particular, the sequence of encoded bits 818 can be evenly divided into the parts 1119-1, ..., 1119-T. The parts 1119-1, ..., 1119-T are placed in the circular buffer 880. The base station 802 selects parts 1119-1, ..., 1119-T—encoded bits from each of the parts 1119-1, ..., 1119-T and sends the selected encoded bits to a respective one of T parallel channel bit interleavers 1182-1, 1182-2, ..., 1182-T. In one example, the number of parallel block interleavers is determined to be half of the number of modulation bits carried by a symbol employed by the base station 802. For example, the base station 802 may use respectively 1, 2, 3, 4, or 5 parallel interleavers when employing QPSK, 16-QAM, 64-QAM, 256-QAM, 1024-QAM symbols. The rate matching output can be evenly divided for each of the block interleavers with higher indexed output bits interleaved and mapped to the higher reliable bit position pair of the QAM symbols.

As described supra, in the sequence of encoded bits 818, the bits having higher indices are more reliable than the bits having lower indices. Therefore, bits selected from parts 1119-T, 1119-(T−1), ..., 1119-1 are mapped to modulation bits, of an employed symbol, having reliability from high to low, similar to what was described supra referring to FIG. 9. As such, output bits with higher indices are interleaved and mapped to the more reliable bit position pair of an employed symbol.

Figure 12:
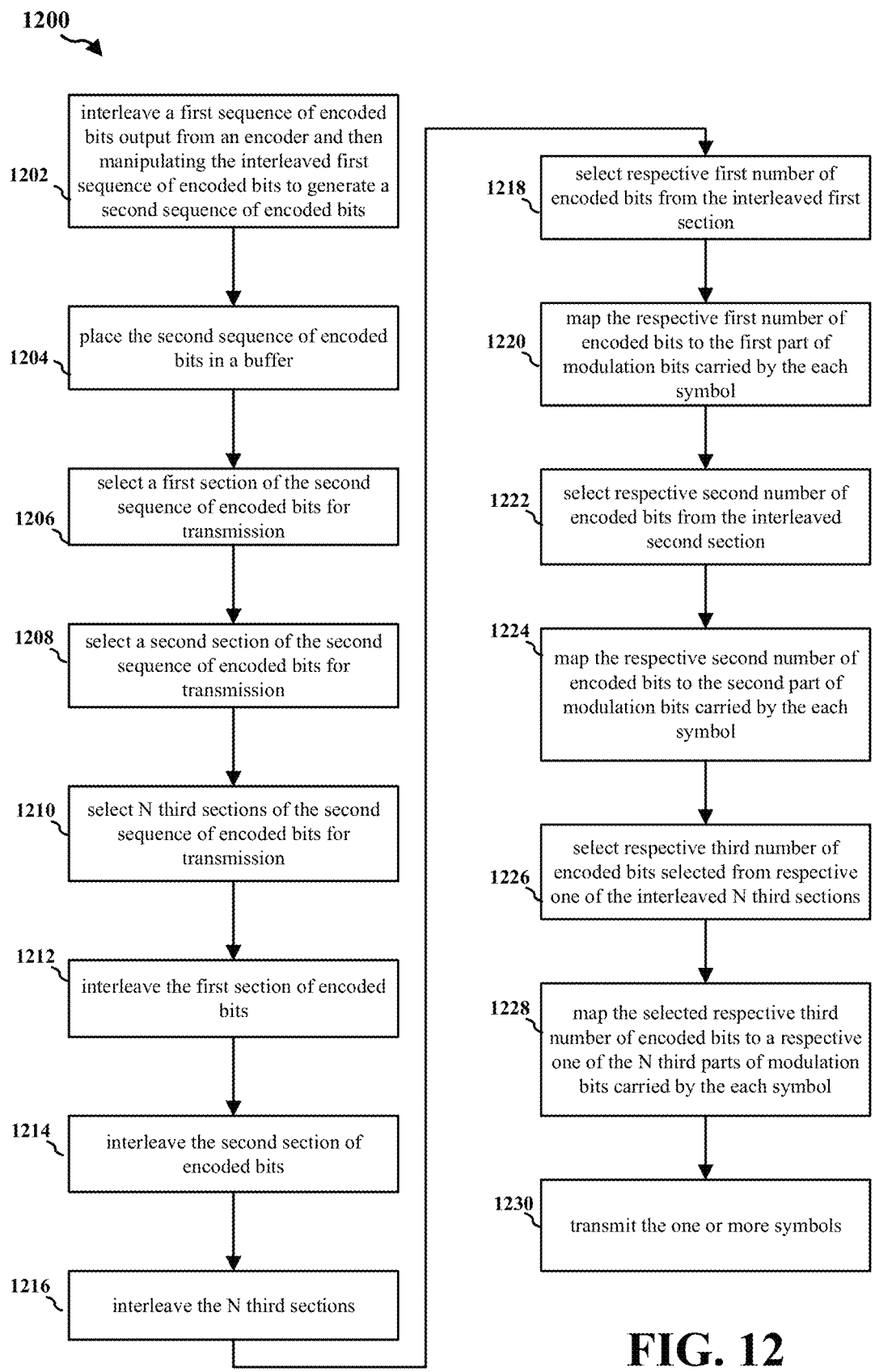
FIG. 12 is a flow chart of a method (process) for interleaving encoded bits.

FIG. 12 is a flow chart 1200 of a method (process) for interleaving encoded bits. The method may be performed by a wireless equipment (e.g., the UE 804, the base station 802, the apparatus 1302, and the apparatus 1302').

At operation 1202, the wireless equipment interleaves a first sequence of encoded bits (e.g., the sequence of encoded bits 814) output from an encoder and then manipulating the interleaved first sequence of encoded bits (e.g., the sequence of encoded bits 816) to generate a second sequence of encoded bits (e.g., the sequence of encoded bits 818). In certain configurations, the manipulating the interleaved first sequence of encoded bits includes at least one of puncturing, shortening, and repeating one or more parts of the interleaved first sequence of encoded bits. At operation 1204, the wireless equipment places the second sequence of encoded bits in a buffer. At operation 1206, in a first technique, the wireless equipment selects, from the buffer (e.g., the circular buffer 880), a first section (e.g., the section of bits 820, the section 920-2) of the second sequence of encoded bits for transmission.

In a second technique, at operation 1208, the wireless equipment additionally selects, from the buffer, a second section (e.g., the section 920-1) of the second sequence of encoded bits for transmission.

In a third technique, at operation 1210, the wireless equipment further selects, from the buffer, N third sections (e.g., the section 1121-1, ..., section 1121-T) of the second sequence of encoded bits for transmission.

In all techniques, at operation 1212, the wireless equipment interleaves (e.g., using the channel bit interleaver 882, the channel bit interleaver 982-2) the first section of encoded bits. In the second technique, at operation 1214, the wireless equipment interleaves (e.g., using the channel bit interleaver 982-1) the second section of encoded bits. In certain configurations, the first section (e.g., the section 920-2) of encoded bits has a higher importance than the second section (e.g., the section 920-1) of encoded bits. In certain configurations, the encoder is a polar encoder. The encoded bits in the first section and encoded bits in the second section are both contiguous. In certain configurations, the first section is interleaved at a first interleaver (e.g., the channel bit interleaver 982-2) and the second section is interleaved at a second interleaver (e.g., the channel bit interleaver 982-1) independent of the first interleaver. In certain configurations, each of the first interleaver and the second interleaver is a block interleaver. In certain configurations, the first interleaver and the second interleaver have a same depth. In certain configurations, a depth of the first interleaver is different from a depth of the second interleaver. In certain configurations, each of the first interleaver and the second interleaver has a size up to 108 bits. In certain configurations, each of the first interleaver and the second interleaver has a size up to 216 bits. In the third technique, at operation 1216, the wireless equipment interleaves (e.g., using the channel bit interleavers 1182-1, 1182-2, ..., 1182-T) the N third sections.

In certain configurations, in the second technique, each of one or more symbols carries a plurality of modulation bits containing a first part of modulation bits (e.g., $\{b_0, b_1\}$) and a second part of modulation bits (e.g., $\{b_2, b_3\}$). The first part of modulation bits is more reliable than the second part of modulation bits. The first part has a first number of modulation bits. The second part has a second number of modulation bits.

In certain configurations, in the second technique, the first section and the second section collectively contain all bits that are selected for transmission from the second sequence of encoded bits. Each of the first number and the second number is 2. Each of the one or more symbols is a 16 QAM symbol. In certain configurations, the first section and the second section have a same size.

At operation 1218, the wireless equipment selects respective first number of encoded bits from the interleaved first section. At operation 1220, the wireless equipment maps the respective first number of encoded bits to the first part of modulation bits carried by the each symbol. In certain configurations, the first section (e.g., the section of bits 820) contains all bits that are selected for transmission from the second sequence of encoded bits. The first section is interleaved at a block interleaver (e.g., the channel bit interleaver 882).

In the second technique, at operation 1222, the wireless equipment also selects respective second number of encoded bits from the interleaved second section. At operation 1224, the wireless equipment maps the respective second number of encoded bits to the second part of modulation bits carried by the each symbol. In certain configurations, the respective first number of encoded bits are selected from the first section in a sequential order in a first direction. The respective second number of encoded bits are selected from the second section in a sequential order in a second direction that is opposite of the first direction. In certain configurations the respective first number of encoded bits are selected from the first section in a sequential order in a first direction. The respective second number of encoded bits are selected from the second section in a sequential order also in the first direction.

In the third technique, the plurality of modulation bits carried by the each symbol further contain N third parts of modulation bits, the N third parts each having a third number of modulation bits, N being an integer greater than 0. At operation 1226, the wireless equipment selects respective third number of encoded bits from a respective one of the interleaved N third sections. In certain configurations, each of the first number, the second number, and the third number is 2. In certain configurations, N is 1. Each of the one or more symbols is a 64 QAM symbol.

At operation 1228, the wireless equipment maps the selected respective third number of encoded bits to a respective one of the N third parts of modulation bits carried by the each symbol. At operation 1230, the wireless equipment transmits the one or more symbols.

Figure 13:
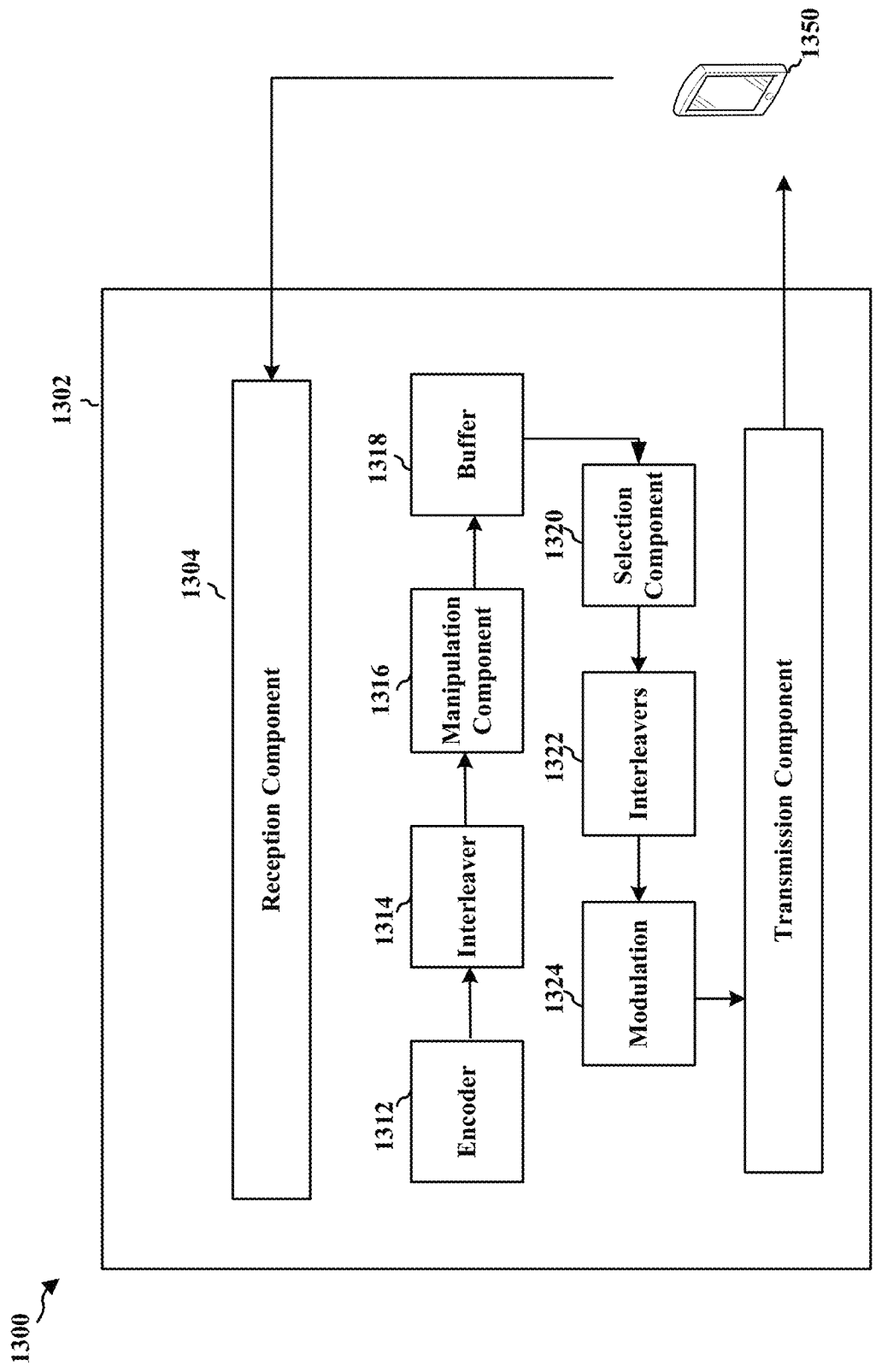
FIG. 13 is a conceptual data flow diagram illustrating the data flow between different components/means in an exemplary apparatus.

FIG. 13 is a conceptual data flow diagram 1300 illustrating the data flow between different components/means in an exemplary apparatus 1302. The apparatus 1302 may be a base station. The apparatus 1302 includes a reception component 1304, a transmission component 1310, an encoder 1312, an interleaver 1314, a manipulation component 1316, a buffer 1318, a selection component 1320, interleavers 1322, a modulation 1324.

The encoder 1312 outputs a first sequence of encoded bits. The interleaver 1314 interleaves the first sequence of encoded bits. The manipulation component 1316 manipulates the interleaved first sequence of encoded bits to generate a second sequence of encoded bits. In certain configurations, the manipulating the interleaved first sequence of encoded bits includes at least one of puncturing, shortening, and repeating one or more parts of the interleaved first sequence of encoded bits. The manipulation component 1316 places the second sequence of encoded bits in the buffer 1318. Some or all of the second sequence of encoded bits are to be mapped to modulation bits of one or more symbols at the modulation 1324.

In a first technique, the selection component 1320 selects, from the buffer 1318, a first section of the second sequence of encoded bits for transmission. In a second technique, the selection component 1320 additionally selects, from the buffer 1318, a second section of the second sequence of encoded bits for transmission. In a third technique, the selection component 1320 further selects, from the buffer 1318, N third sections of the second sequence of encoded bits for transmission.

In all techniques, a first interleaver of the interleavers 1322 interleaves the first section of encoded bits. In the second technique, a second interleaver of the interleavers 1322 interleaves the second section of encoded bits. In certain configurations, the first section of encoded bits has a higher importance than the second section of encoded bits. In certain configurations, the encoder 1312 is a polar encoder. The encoded bits in the first section and encoded bits in the second section are both contiguous. In certain configurations, the second interleaver independent of the first interleaver. In certain configurations, each of the first interleaver and the second interleaver is a block interleaver. In certain configurations, the first interleaver and the second interleaver have a same depth. In certain configurations, a depth of the first interleaver is different from a depth of the second interleaver. In certain configurations, each of the first interleaver and the second interleaver has a size up to 108 bits. In certain configurations, each of the first interleaver and the second interleaver has a size up to 216 bits. Further, in the third technique, the interleavers 1322 interleaves the N third sections.

In certain configurations, in the second technique, each of the one or more symbols carries a plurality of modulation bits containing a first part of modulation bits and a second part of modulation bits. The first part of modulation bits is more reliable than the second part of modulation bits. The first part has a first number of modulation bits. The second part has a second number of modulation bits.

In certain configurations, in the second technique, the first section and the second section collectively contain all bits that are selected for transmission from the second sequence of encoded bits. Each of the first number and the second number is 2. Each of the one or more symbols is a 16 QAM symbol. In certain configurations, the first section and the second section have a same size.

The selection component 1320 selects respective first number of encoded bits from the interleaved first section. The modulation 1324 maps the respective first number of encoded bits to the first part of modulation bits carried by the each symbol. In certain configurations, the first section contains all bits that are selected for transmission from the second sequence of encoded bits. The first section is interleaved at a block interleaver.

In the second technique, the selection component 1320 also selects respective second number of encoded bits from the interleaved second section. The modulation 1324 maps the respective second number of encoded bits to the second part of modulation bits carried by the each symbol. In certain configurations, the respective first number of encoded bits are selected from the first section in a sequential order in a first direction. The respective second number of encoded bits are selected from the second section in a sequential order in a second direction that is opposite of the first direction. In certain configurations the respective first number of encoded bits are selected from the first section in a sequential order in a first direction. The respective second number of encoded bits are selected from the second section in a sequential order also in the first direction.

In the third technique, the plurality of modulation bits carried by the each symbol further contain N third parts of modulation bits, the N third parts each having a third number of modulation bits, N being an integer greater than 0. The selection component 1320 selects respective third number of encoded bits from a respective one of the interleaved N third sections. In certain configurations, each of the first number, the second number, and the third number is 2. In certain configurations, N is 1. Each of the one or more symbols is a 64 QAM symbol. The modulation 1324 maps the selected respective third number of encoded bits to a respective one of the N third parts of modulation bits carried by the each symbol. The transmission component 1310 transmits the one or more symbols to a UE 1350.

Figure 14:
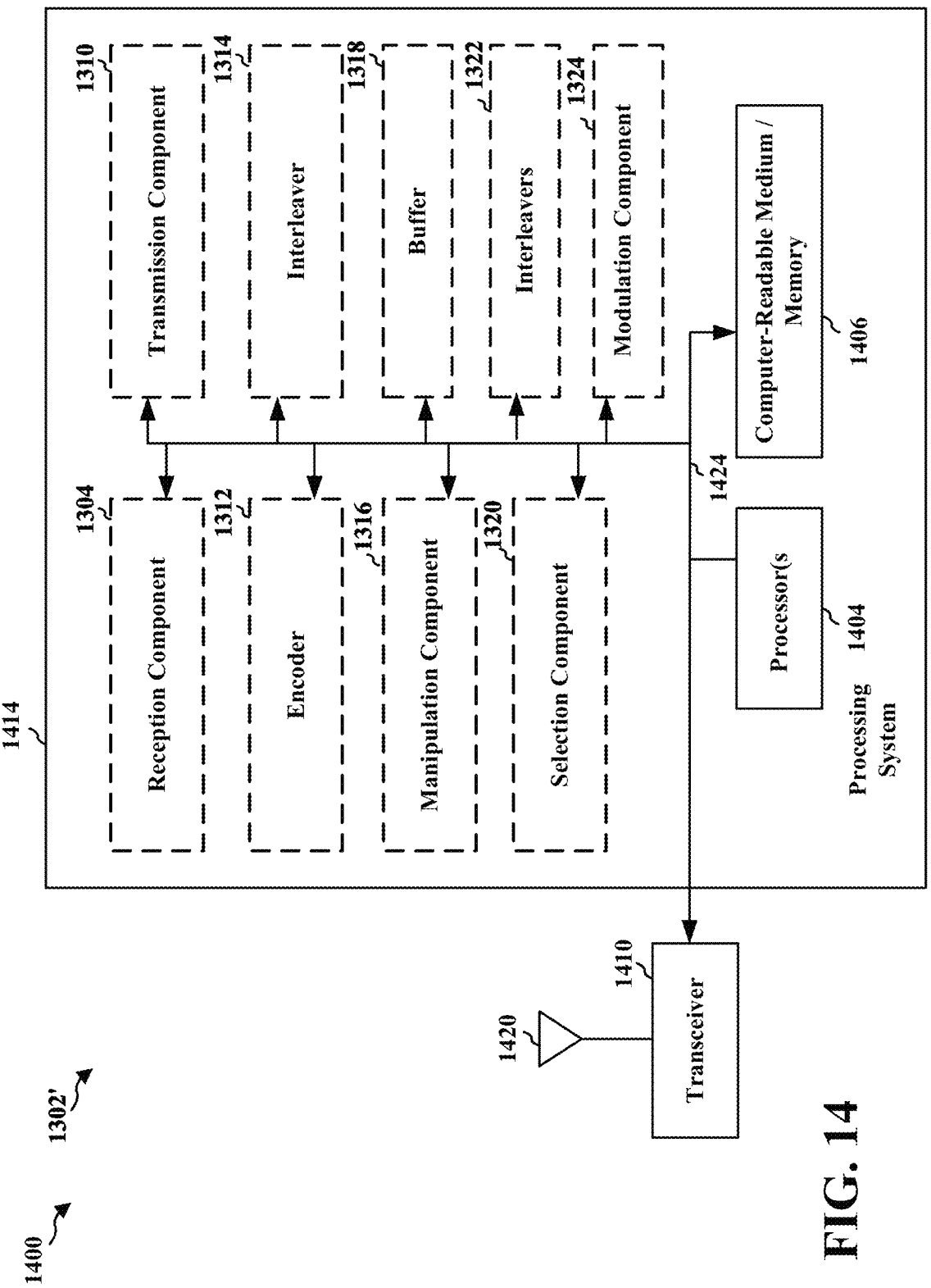
FIG. 14 is a diagram illustrating an example of a hardware implementation for an apparatus employing a processing system.

FIG. 14 is a diagram 1400 illustrating an example of a hardware implementation for an apparatus 1302' employing a processing system 1414. The apparatus 1302' may be a base station. The processing system 1414 may be implemented with a bus architecture, represented generally by a bus 1424. The bus 1424 may include any number of interconnecting buses and bridges depending on the specific application of the processing system 1414 and the overall design constraints. The bus 1424 links together various circuits including one or more processors and/or hardware components, represented by one or more processors 1404, the reception component 1304, the transmission component 1310, the encoder 1312, the interleaver 1314, the manipulation component 1316, the buffer 1318, the selection component 1320, the interleavers 1322, the modulation 1324, and a computer-readable medium/memory 1406. The bus 1424 may also link various other circuits such as timing sources, peripherals, voltage regulators, and power management circuits, etc.

The processing system 1414 may be coupled to a transceiver 1410, which may be one or more of the transceivers 354. The transceiver 1410 is coupled to one or more antennas 1420, which may be the communication antennas 320.

The transceiver 1410 provides a means for communicating with various other apparatus over a transmission medium. The transceiver 1410 receives a signal from the one or more antennas 1420, extracts information from the received signal, and provides the extracted information to the processing system 1414, specifically the reception component 1304. In addition, the transceiver 1410 receives information from the processing system 1414, specifically the transmission component 1310, and based on the received information, generates a signal to be applied to the one or more antennas 1420.

The processing system 1414 includes one or more processors 1404 coupled to a computer-readable medium/memory 1406. The one or more processors 1404 are responsible for general processing, including the execution of software stored on the computer-readable medium/memory 1406. The software, when executed by the one or more processors 1404, causes the processing system 1414 to perform the various functions described supra for any particular apparatus. The computer-readable medium/memory 1406 may also be used for storing data that is manipulated by the one or more processors 1404 when executing software. The processing system 1414 further includes at least one of a reception component 1304, a transmission component 1310, an encoder 1312, an interleaver 1314, a manipulation component 1316, a buffer 1318, a selection component 1320, interleavers 1322, and a modulation 1324. The components may be software components running in the one or more processors 1404, resident/stored in the computer readable medium/memory 1406, one or more hardware components coupled to the one or more processors 1404, or some combination thereof. The processing system 1414 may be a component of the UE 350 and may include the memory 360 and/or at least one of the TX processor 368, the RX processor 356, and the communication processor 359.

In one configuration, the apparatus 1302/apparatus 1302' for wireless communication includes means for performing each of the operations of FIG. 12. The aforementioned means may be one or more of the aforementioned components of the apparatus 1302 and/or the processing system 1414 of the apparatus 1302' configured to perform the functions recited by the aforementioned means.

As described supra, the processing system 1414 may include the TX Processor 316, the RX Processor 370, and the controller/processor 375. As such, in one configuration, the aforementioned means may be the TX Processor 316, the RX Processor 370, and the controller/processor 375 configured to perform the functions recited by the aforementioned means.

It is understood that the specific order or hierarchy of blocks in the processes/flowcharts disclosed is an illustration of exemplary approaches. Based upon design preferences, it is understood that the specific order or hierarchy of blocks in the processes/flowcharts may be rearranged. Further, some blocks may be combined or omitted. The accompanying method claims present elements of the various blocks in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

What is claimed is:

1. A method of wireless communication using wireless equipment, comprising:

interleaving a first sequence of encoded bits output from an encoder and then manipulating the interleaved first sequence of encoded bits to generate a second sequence of encoded bits;

placing the second sequence of encoded bits in a buffer;

selecting, from the buffer, a first section of the second sequence of encoded bits for transmission;

interleaving the first section of encoded bits;

selecting respective first number of encoded bits from the interleaved first section;

mapping the respective first number of encoded bits to the first part of modulation bits carried by the each symbol;

selecting, from the buffer, a second section of the second sequence of encoded bits for transmission;

interleaving the second section of encoded bits;

selecting respective second number of encoded bits from the interleaved second section;

mapping the respective second number of encoded bits to the second part of modulation bits carried by the each symbol; and transmitting, through a radio frequency (RF) transmission component and an antenna of the wireless equipment, the interleaved first section of encoded bits and the interleaved second section of encoded bits via one or more symbols, wherein each of the one or more symbols carries a plurality of modulation bits containing a first part of modulation bits and a second part of modulation bits, the first part of modulation bits being more reliable than the second part of modulation bits, the first part having a first number of modulation bits, the second part having a second number of modulation bits.

2. The method of claim 1, wherein the first section of encoded bits has a higher importance than the second section of encoded bits.

3. The method of claim 2, wherein the encoder is a polar encoder, wherein encoded bits in the first section and encoded bits in the second section are both contiguous.

4. The method of claim 1, wherein the first section and the second section collectively contain all bits that are selected for transmission from the second sequence of encoded bits, wherein each of the first number and the second number is 2, wherein each of the one or more symbols is a 16 quadrature amplitude modulation (QAM) symbol.

5. The method of claim 1, wherein the first section and the second section have a same size.

6. The method of claim 1, wherein the plurality of modulation bits carried by the each symbol further contain N third parts of modulation bits, the N third parts each having a third number of modulation bits, N being an integer greater than 0, the method further comprising:

selecting, from the buffer, N third sections of the second sequence of encoded bits for transmission;

interleaving the N third sections;

selecting respective third number of encoded bits from a respective one of the interleaved N third sections; and mapping the selected respective third number of encoded bits to a respective one of the N third parts of modulation bits carried by the each symbol.

7. The method of claim 6, wherein each of the first number, the second number, and the third number is 2.

8. The method of claim 7, wherein N is 1, wherein each of the one or more symbols is a 64 quadrature amplitude modulation (QAM) symbol.

9. The method of claim 1, wherein the first section is interleaved at a first interleaver and the second section is interleaved at a second interleaver independent of the first interleaver.

10. The method of claim 9, wherein each of the first interleaver and the second interleaver is a block interleaver.

11. The method of claim 10, wherein each of the first interleaver and the second interleaver has a size up to 108 bits.

12. The method of claim 10, wherein each of the first interleaver and the second interleaver has a size up to 216 bits.

13. The method of claim 10, wherein the first interleaver and the second interleaver have a same depth.

14. The method of claim 13, wherein the respective first number of encoded bits are selected from the first section in a sequential order in a first direction, wherein the respective second number of encoded bits are selected from the second section in a sequential order in a second direction that is opposite of the first direction.

15. The method of claim 10, wherein a depth of the first interleaver is different from a depth of the second interleaver.

16. The method of claim 15, wherein the respective first number of encoded bits are selected from the first section in a sequential order in a first direction, wherein the respective second number of encoded bits are selected from the second section in a sequential order also in the first direction.

17. The method of claim 1, wherein the first section contains all bits that are selected for transmission from the second sequence of encoded bits, and wherein the first section is interleaved at a block interleaver.

18. The method of claim 17, wherein the block interleaver has a size up to 108 bits.

19. The method of claim 17, wherein the block interleaver has a size up to 216 bits.

20. The method of claim 1, wherein the manipulating the interleaved first sequence of encoded bits includes at least one of puncturing, shortening, and repeating one or more parts of the interleaved first sequence of encoded bits.

21. An apparatus for wireless communication, comprising:

a memory; and at least one processor coupled to the memory and configured to:

interleave a first sequence of encoded bits output from an encoder and then manipulating the interleaved first sequence of encoded bits to generate a second sequence of encoded bits;

place the second sequence of encoded bits in a buffer;

select, from the buffer, a first section of the second sequence of encoded bits for transmission;

interleave the first section of encoded bits;

select respective first number of encoded bits from the interleaved first section;

map the respective first number of encoded bits to the first part of modulation bits carried by the each symbol;

select, from the buffer, a second section of the second sequence of encoded bits for transmission;

interleave the second section of encoded bits;

select respective second number of encoded bits from the interleaved second section;

map the respective second number of encoded bits to the second part of modulation bits carried by the each symbol; and transmit, through a radio frequency (RF) transmission component and an antenna of the wireless equipment, the interleaved first section of encoded bits and the interleaved second section of encoded bits via one or more symbols, wherein each of the one or more symbols carries a plurality of modulation bits containing a first part of modulation bits and a second part of modulation bits, the first part of modulation bits being more reliable than the second part of modulation bits, the first part having a first number of modulation bits, the second part having a second number of modulation bits.

22. A non-transitory computer-readable medium storing computer executable code for wireless communication of wireless equipment, comprising code to:
interleave a first sequence of encoded bits output from an encoder and then manipulating the interleaved first sequence of encoded bits to generate a second sequence of encoded bits;
place the second sequence of encoded bits in a buffer;
select, from the buffer, a first section of the second sequence of encoded bits for transmission;
interleave the first section of encoded bits;
select respective first number of encoded bits from the interleaved first section;
map the respective first number of encoded bits to the first part of modulation bits carried by the each symbol;
select, from the buffer, a second section of the second sequence of encoded bits for transmission;
interleave the second section of encoded bits;
select respective second number of encoded bits from the interleaved second section;
map the respective second number of encoded bits to the second part of modulation bits carried by the each symbol; and
transmit, through a radio frequency (RF) transmission component and an antenna of the wireless equipment, the interleaved first section of encoded bits and the interleaved second section of encoded bits via one or more symbols, wherein each of the one or more symbols carries a plurality of modulation bits containing a first part of modulation bits and a second part of modulation bits, the first part of modulation bits being more reliable than the second part of modulation bits, the first part having a first number of modulation bits, the second part having a second number of modulation bits.

* * * * *